(12) United States Patent
Moon et al.

(10) Patent No.: US 10,693,049 B2
(45) Date of Patent: Jun. 23, 2020

(54) LIGHT EMITTING DEVICE PACKAGE AND LIGHTING SYSTEM COMPRISING SAME

(71) Applicant: LG INNOTEK CO., LTD., Seoul (KR)

(72) Inventors: Keal Doo Moon, Seoul (KR); Dong Yong Lee, Seoul (KR); Sang Jun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/771,281

(22) PCT Filed: Oct. 26, 2016

(86) PCT No.: PCT/KR2016/012104
§ 371 (c)(1),
(2) Date: Apr. 26, 2018

(87) PCT Pub. No.: WO2017/074035
PCT Pub. Date: May 4, 2017

(65) Prior Publication Data
US 2018/0358520 A1  Dec. 13, 2018

(30) Foreign Application Priority Data

Oct. 26, 2015 (KR) .................. 10-2015-0148855
Oct. 27, 2015 (KR) .................. 10-2015-0149181

(51) Int. Cl.
*F21V 8/00* (2006.01)
*H01L 33/60* (2010.01)
(Continued)

(52) U.S. Cl.
CPC .............. *H01L 33/60* (2013.01); *H01L 33/46* (2013.01); *H01L 33/465* (2013.01);
(Continued)

(58) Field of Classification Search
None
See application file for complete search history.

(56) References Cited

U.S. PATENT DOCUMENTS 7,148,514 B2 * 12/2006 Seo ................... H01L 33/46
257/79
10,297,722 B2 * 5/2019 Chang ................ H01L 33/20
(Continued)

FOREIGN PATENT DOCUMENTS

JP  2012-227470 A  11/2012
JP  2014-110333 A   6/2014
(Continued)

*Primary Examiner* — Ali Naraghi
(74) *Attorney, Agent, or Firm* — Birch, Stewart, Kolasch & Birch, LLP

(57) ABSTRACT

One embodiment relates to a light emitting device package having improved luminous flux, and a light emitting device package, according to one embodiment of the present invention, comprises: a light emitting device having an electrode pad arranged at a lower surface thereof; a wavelength conversion layer for covering four lateral surfaces of the light emitting device; a first reflective pattern for covering an upper surface of the light emitting device and three lateral surfaces of the light emitting device so as to expose the wavelength conversion layer of the one remaining lateral surface, which is a light emitting surface of the light emitting device; and a second reflective pattern arranged between the first reflective pattern and the upper surface of the light emitting device.

7 Claims, 18 Drawing Sheets

(51) Int. Cl.
  *H01L 33/46* (2010.01)
  *H01L 33/62* (2010.01)
  *H01L 33/50* (2010.01)
  *H01L 33/38* (2010.01)

(52) U.S. Cl.
  CPC .......... *H01L 33/502* (2013.01); *H01L 33/505* (2013.01); *H01L 33/508* (2013.01); *H01L 33/62* (2013.01); *H01L 33/382* (2013.01); *H01L 2933/0016* (2013.01); *H01L 2933/0066* (2013.01)

(56) References Cited

U.S. PATENT DOCUMENTS

2010/0078670 A1\* 4/2010 Kim ........................ H01L 33/48
  257/98
2013/0214298 A1\* 8/2013 Lin ........................ H01L 33/60
  257/88
2015/0085527 A1 3/2015 Nam et al.
2016/0306101 A1\* 10/2016 Lee ....................... H01L 33/505

FOREIGN PATENT DOCUMENTS

JP  2015-111743 A  6/2015
KR  10-2015-0035399 A  4/2015
KR  10-2015-0066186 A  6/2015

\* cited by examiner

【Figure. 1a】
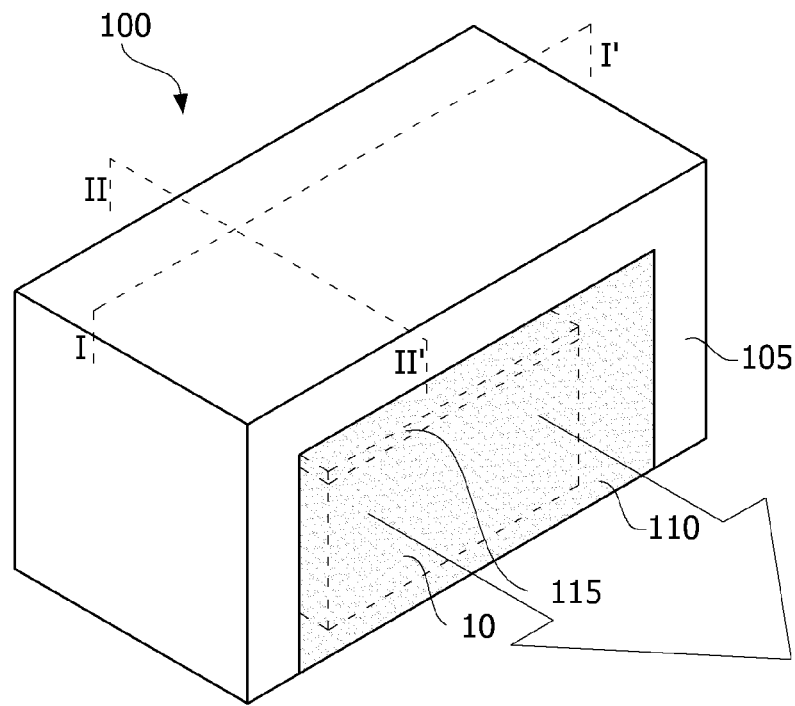
【Figure. 1b】
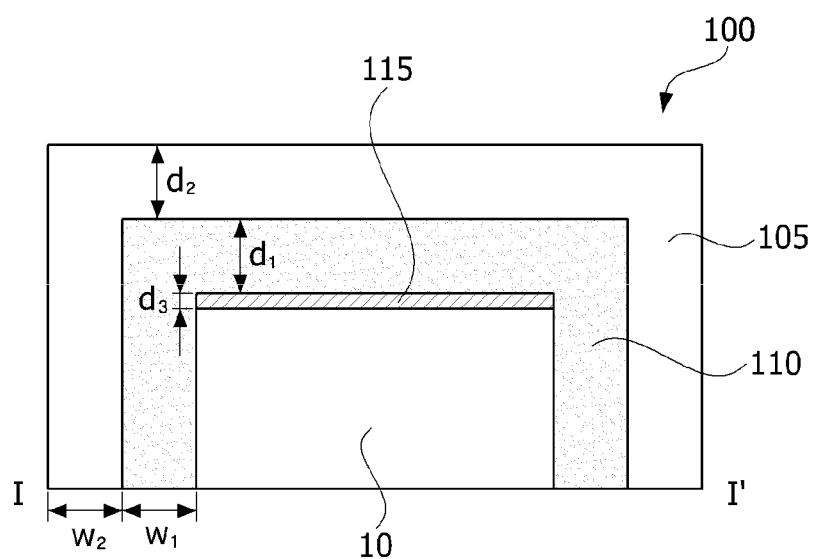

【Figure. 1c】
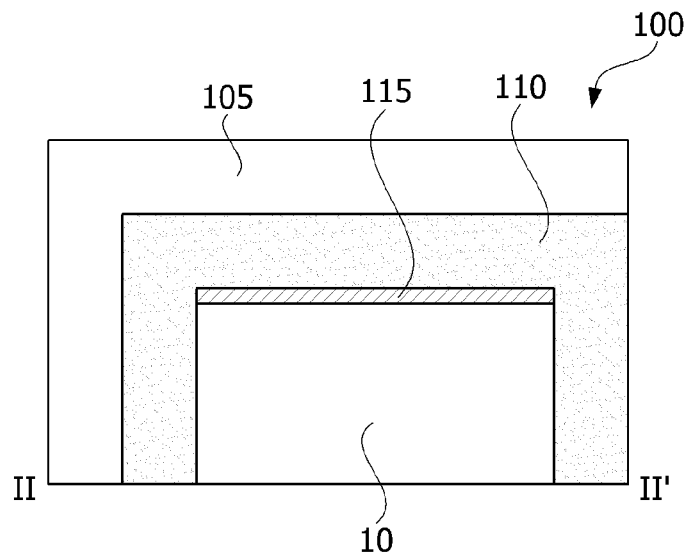
【Figure. 1d】
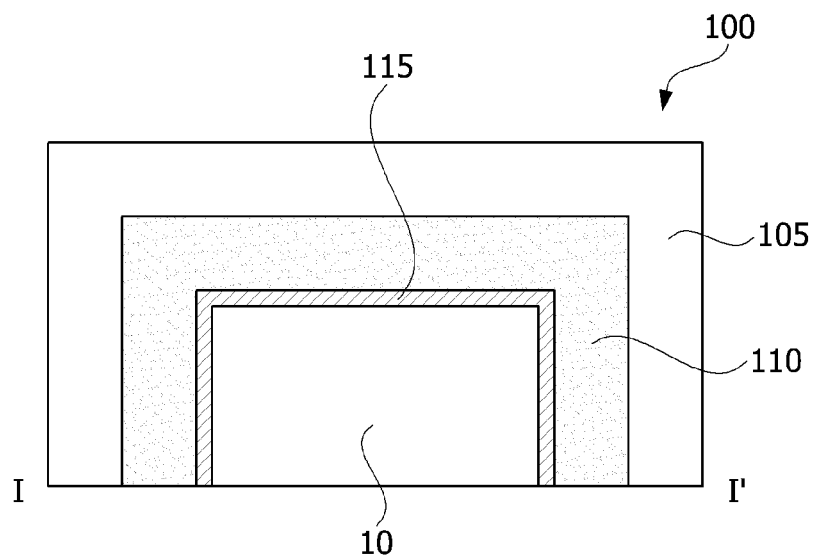

【Figure. 1e】
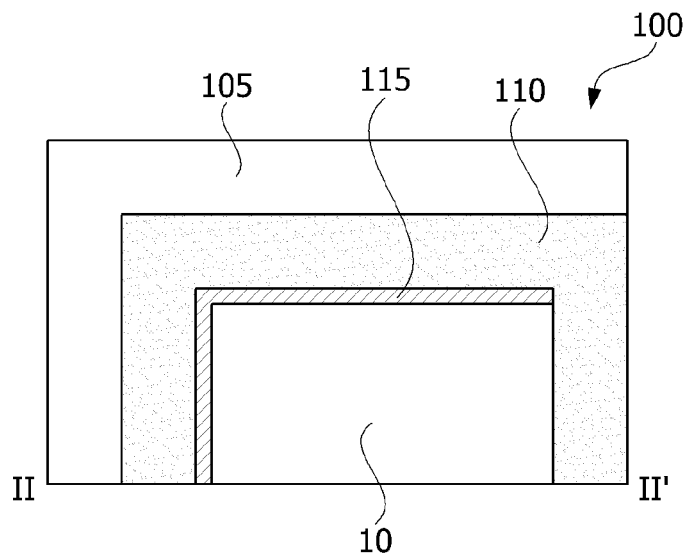
【Figure. 2a】
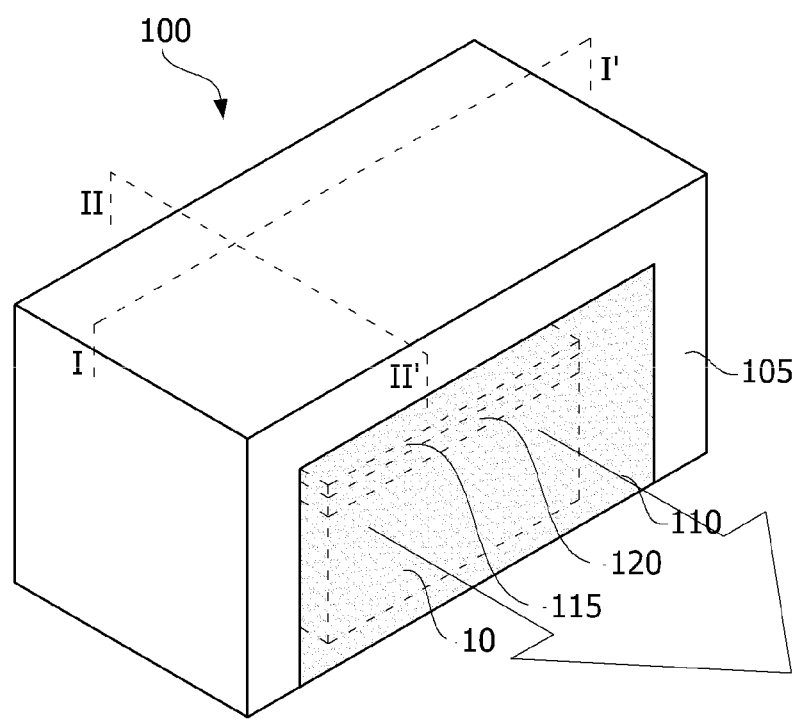

【Figure. 2b】
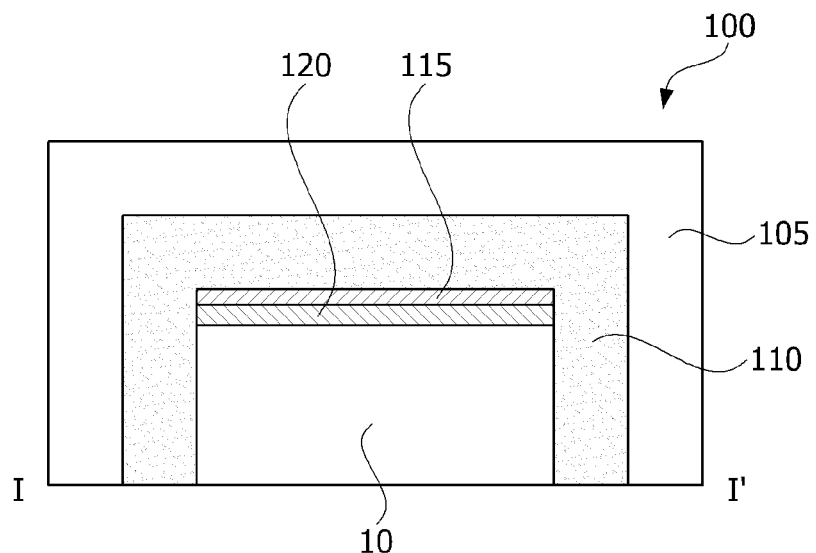
【Figure. 2c】
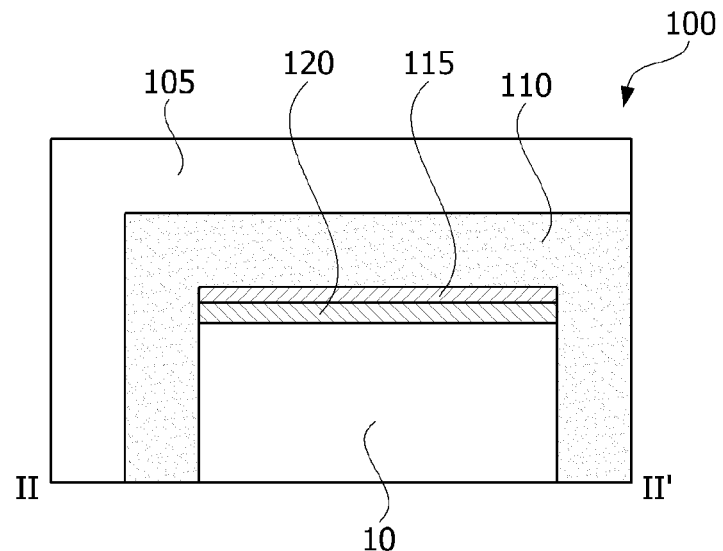

【Figure. 2d】
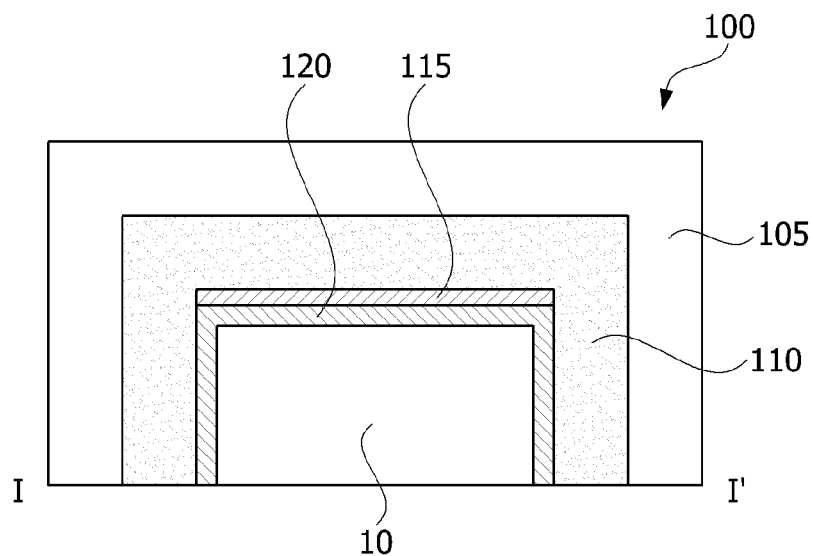
【Figure. 2e】
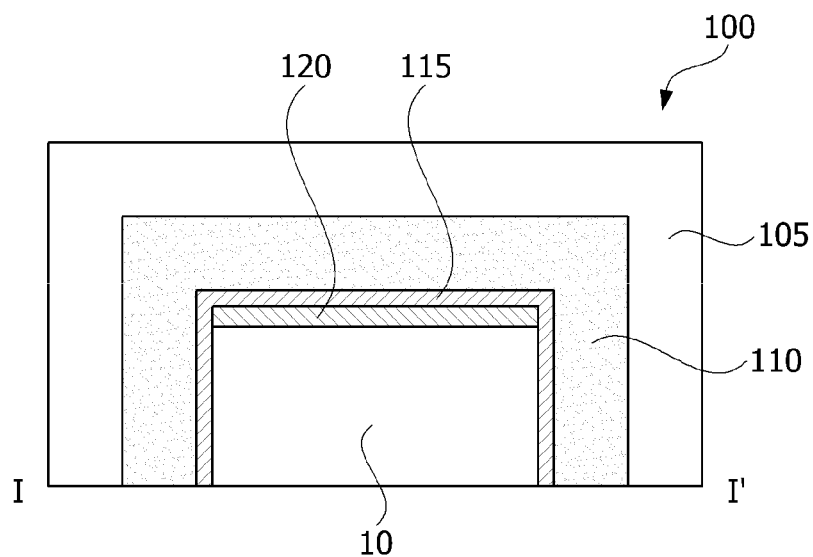

【Figure. 2f】
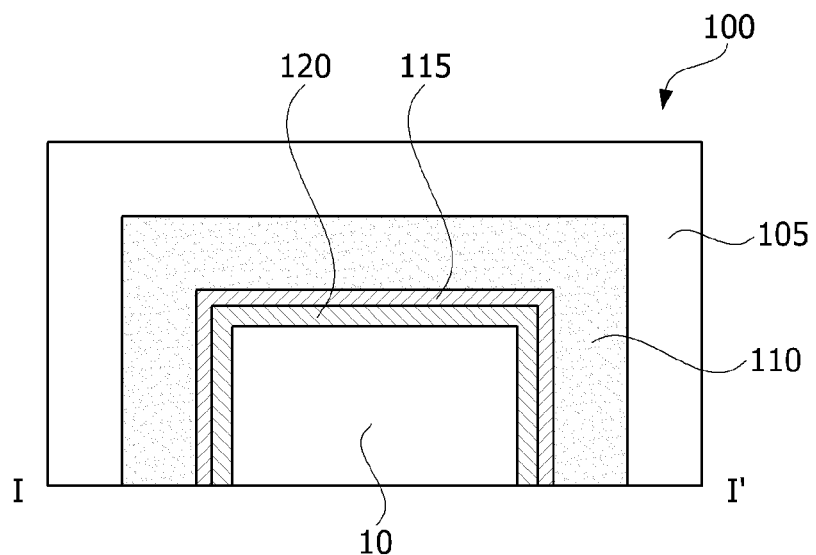
【Figure. 2g】
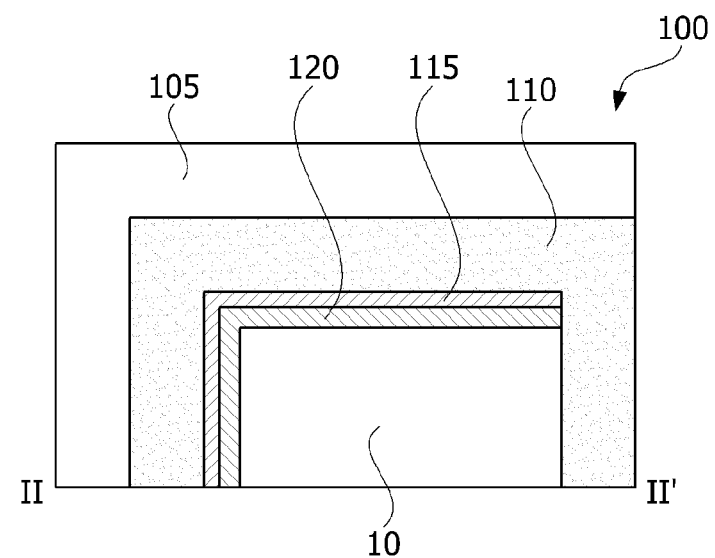

【Figure. 3a】
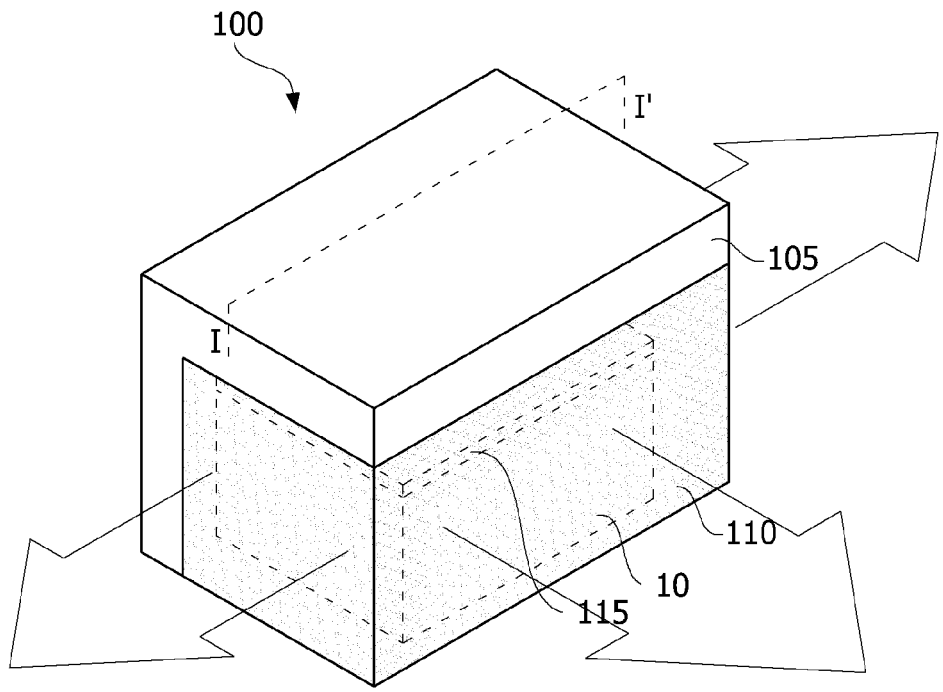
【Figure. 3b】
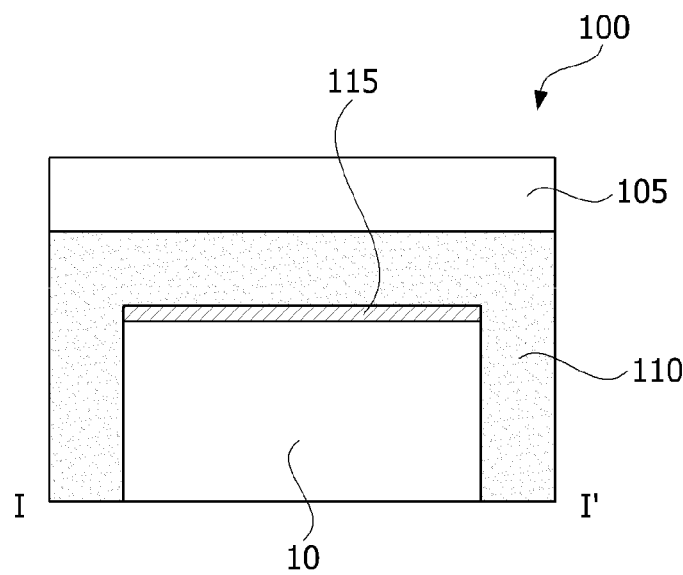

【Figure. 4a】
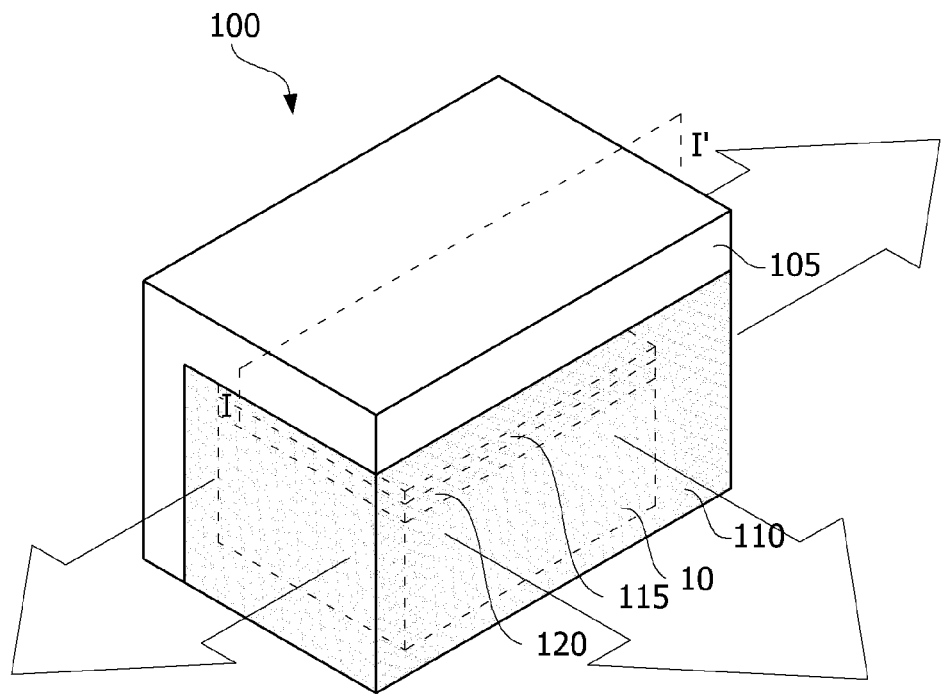
【Figure. 4b】
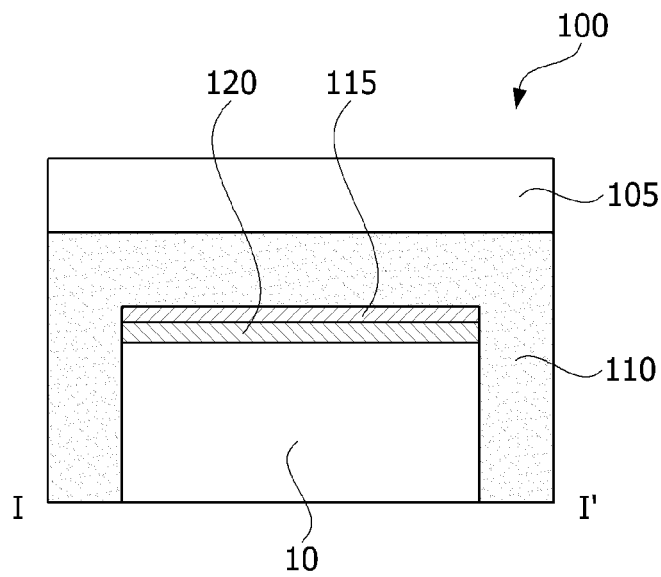

【Figure. 5a】
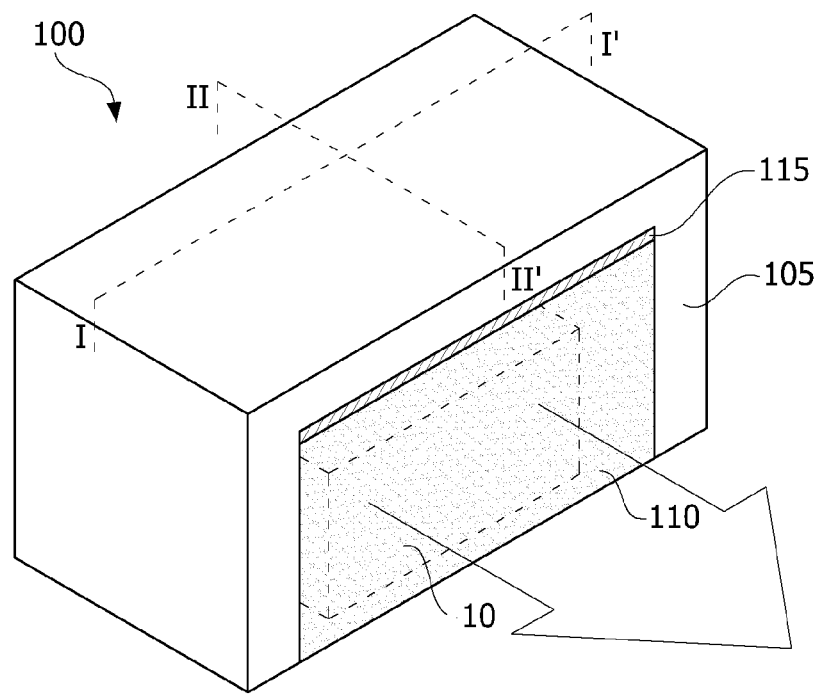
【Figure. 5b】
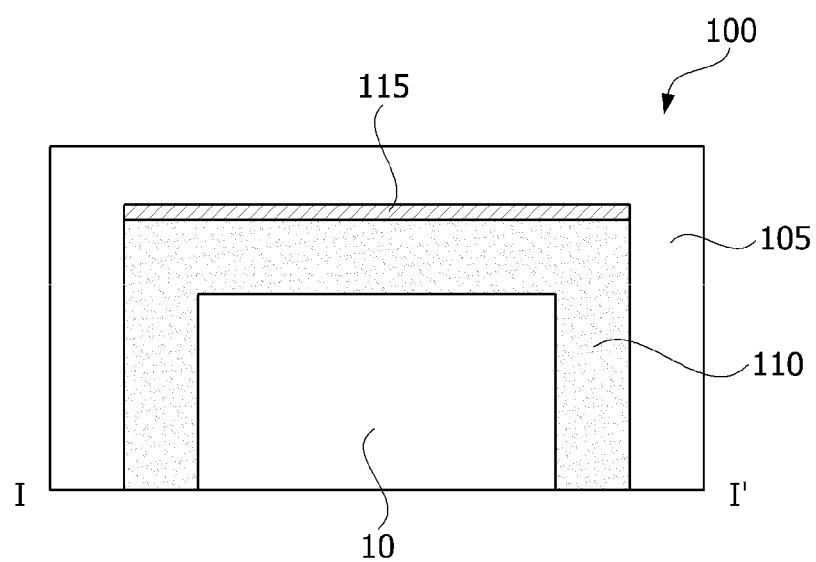

【Figure. 5c】
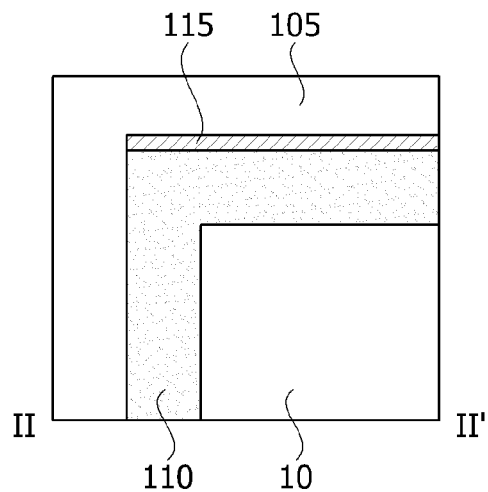
【Figure. 6a】
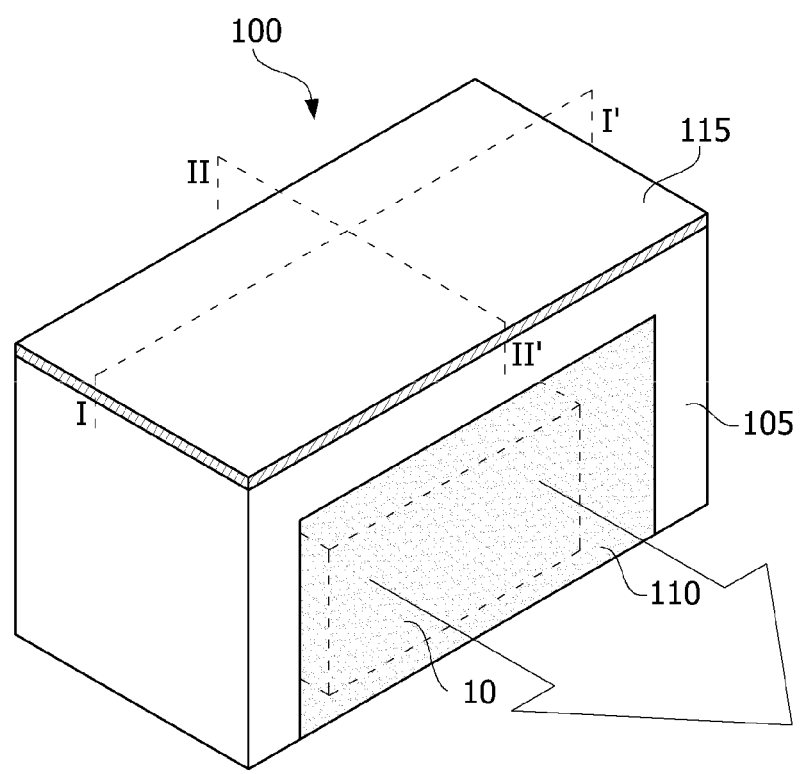

【Figure. 6b】
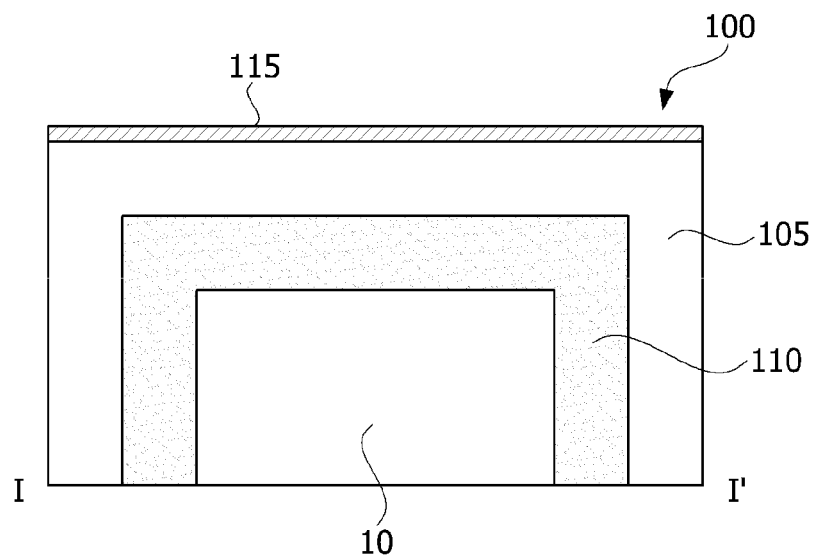
【Figure. 6c】
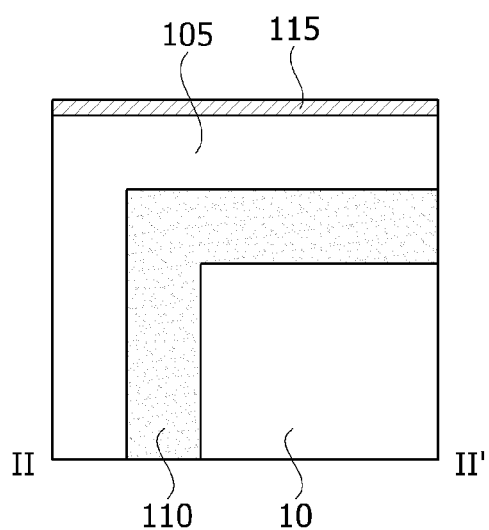

【Figure. 7a】
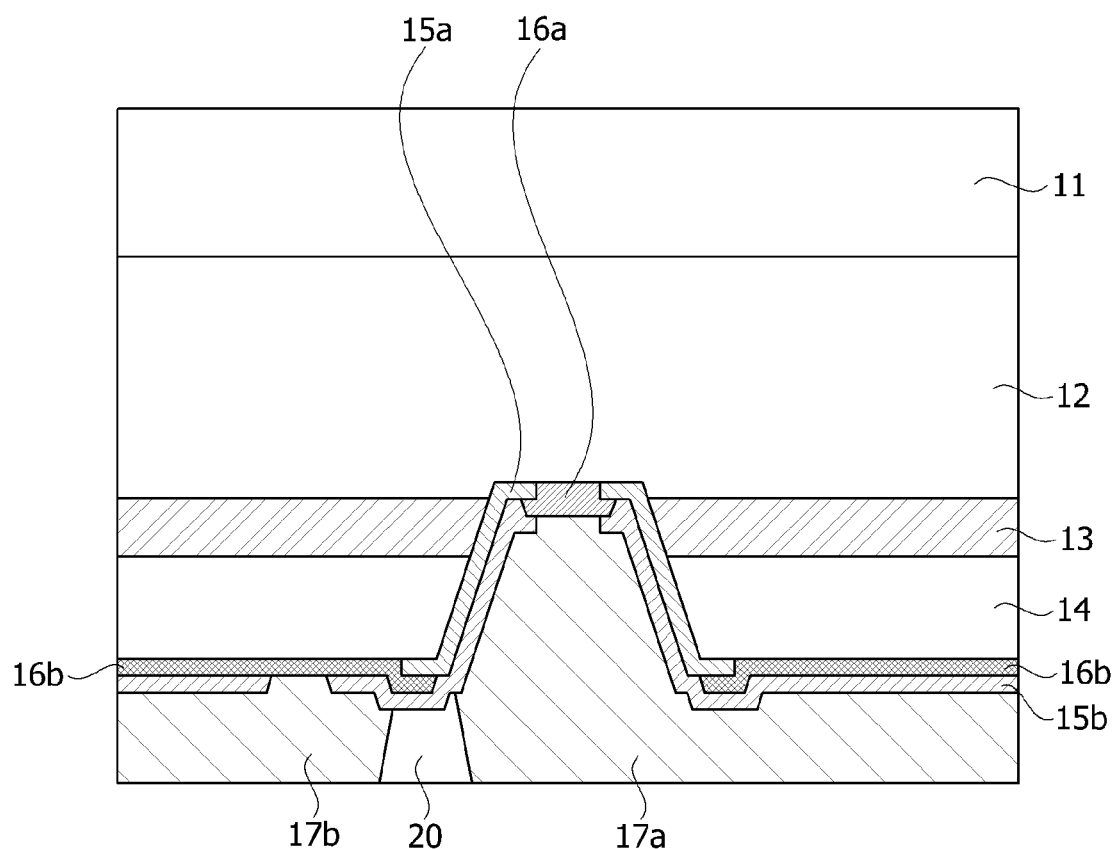

【Figure. 7b】
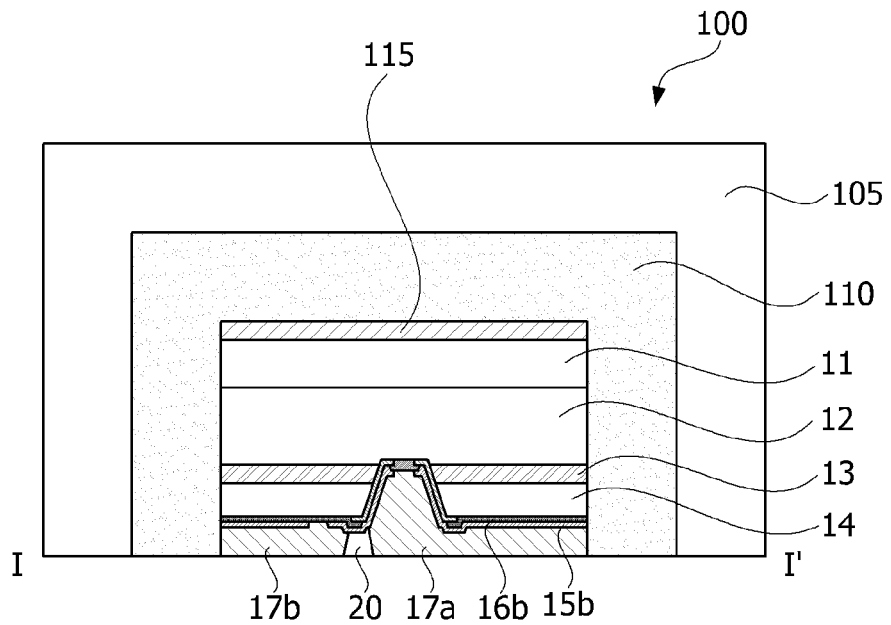
【Figure. 8a】
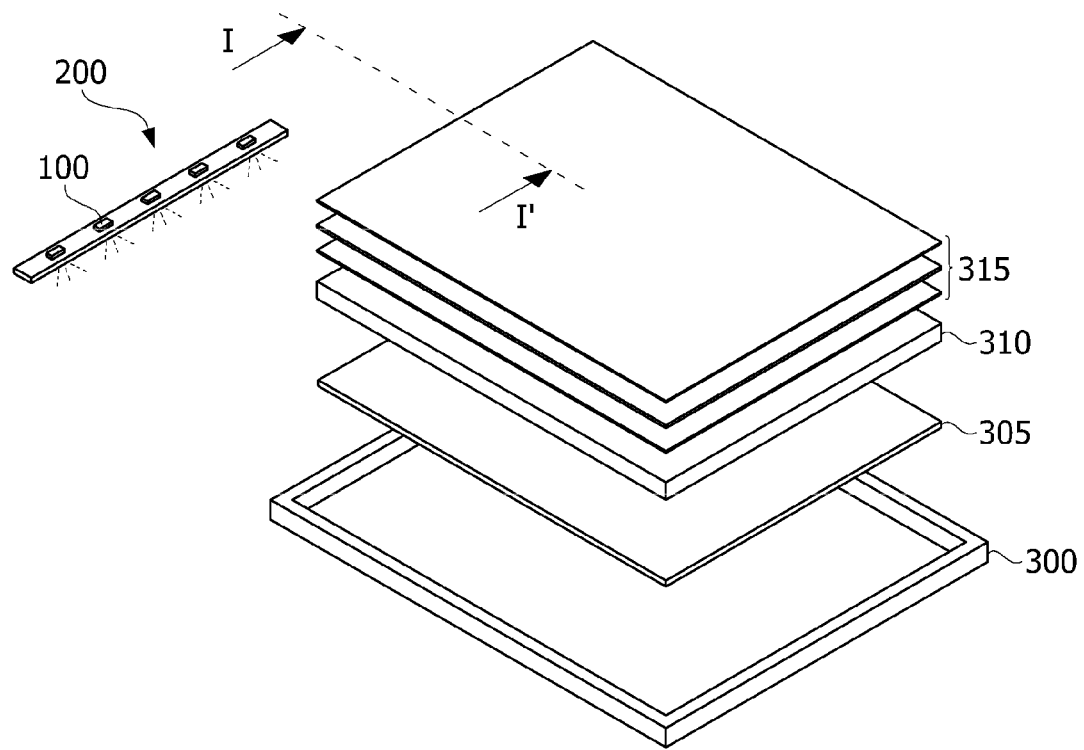

【Figure. 8b】
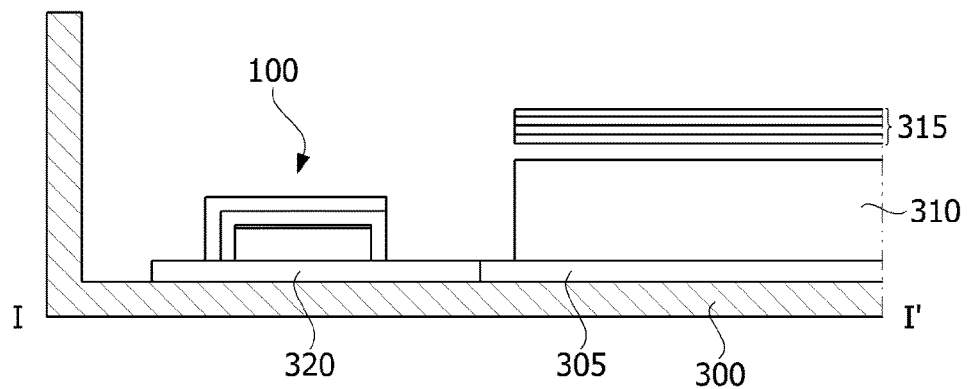
【Figure. 9】
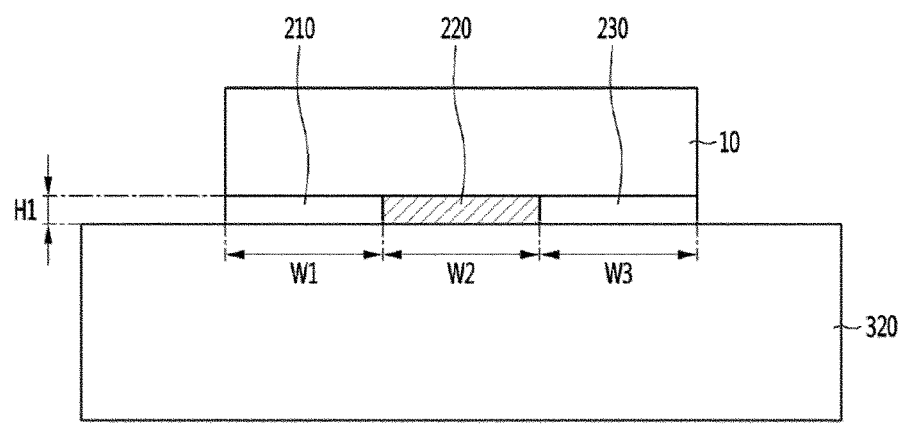
【Figure. 10】
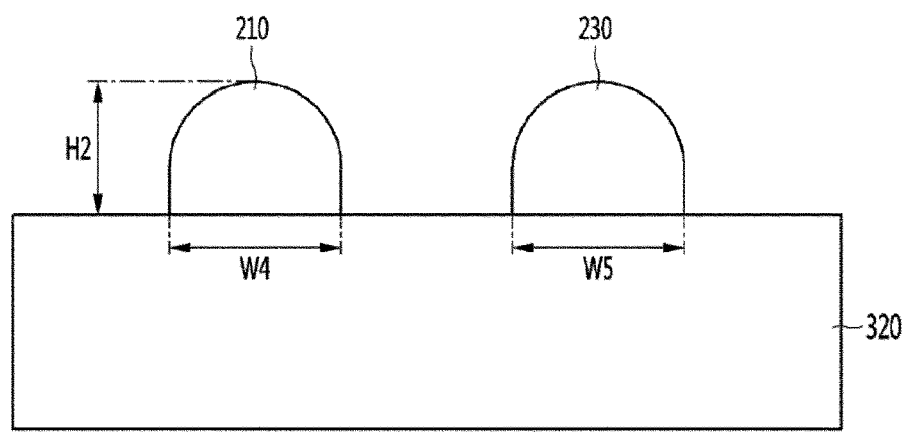

【Figure. 11】
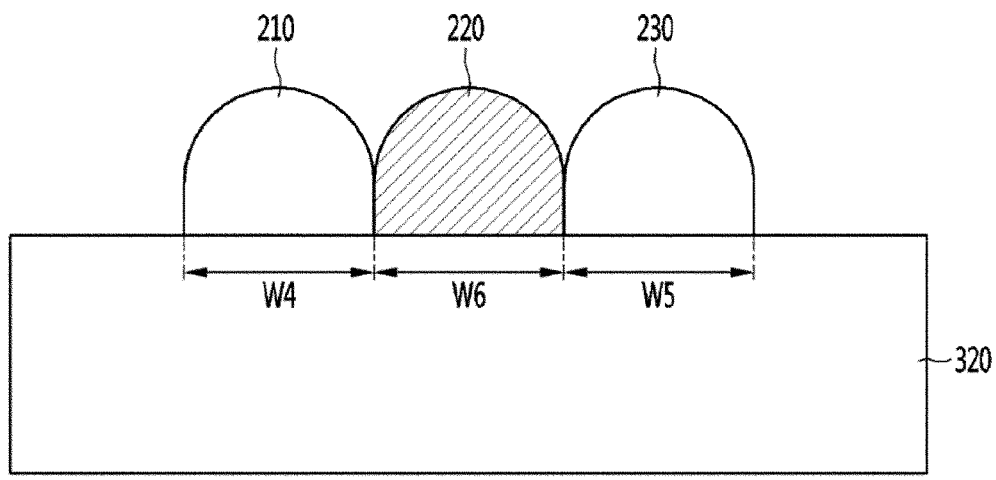
【Figure. 12】
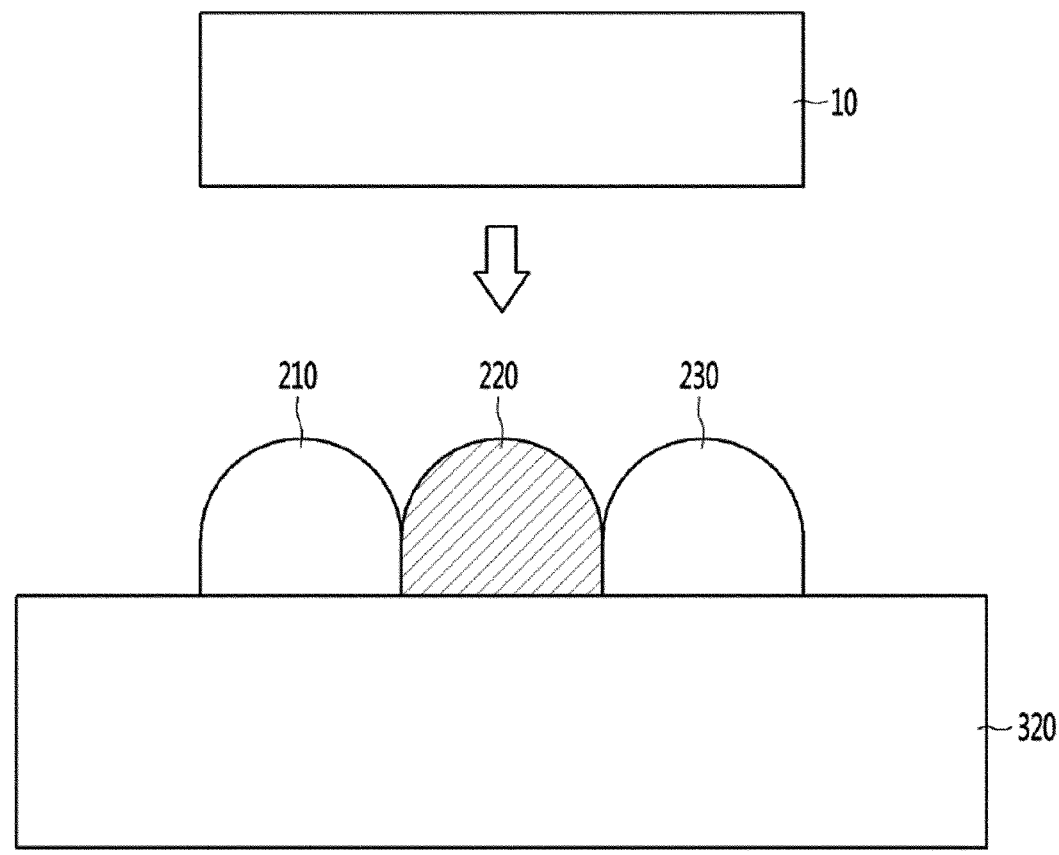

【Figure. 13】
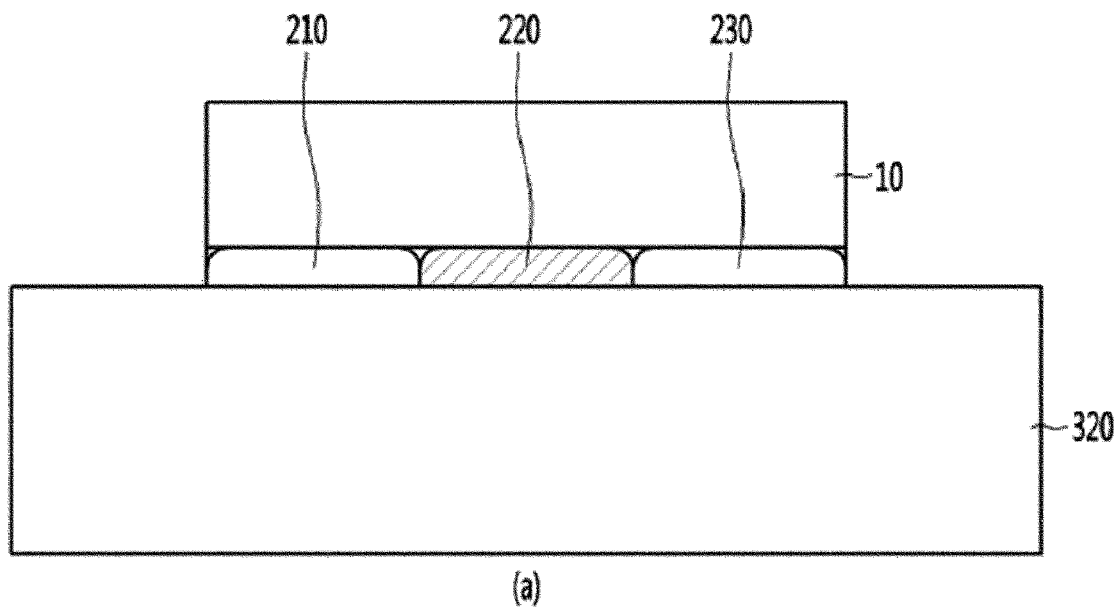
(a)
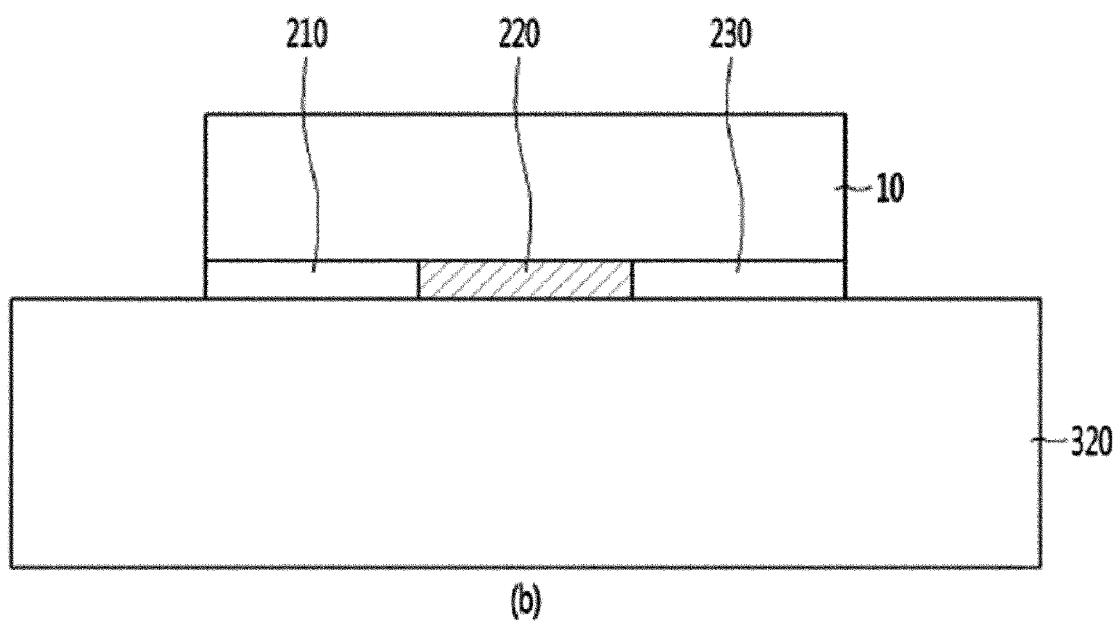
(b)

【Figure. 14】
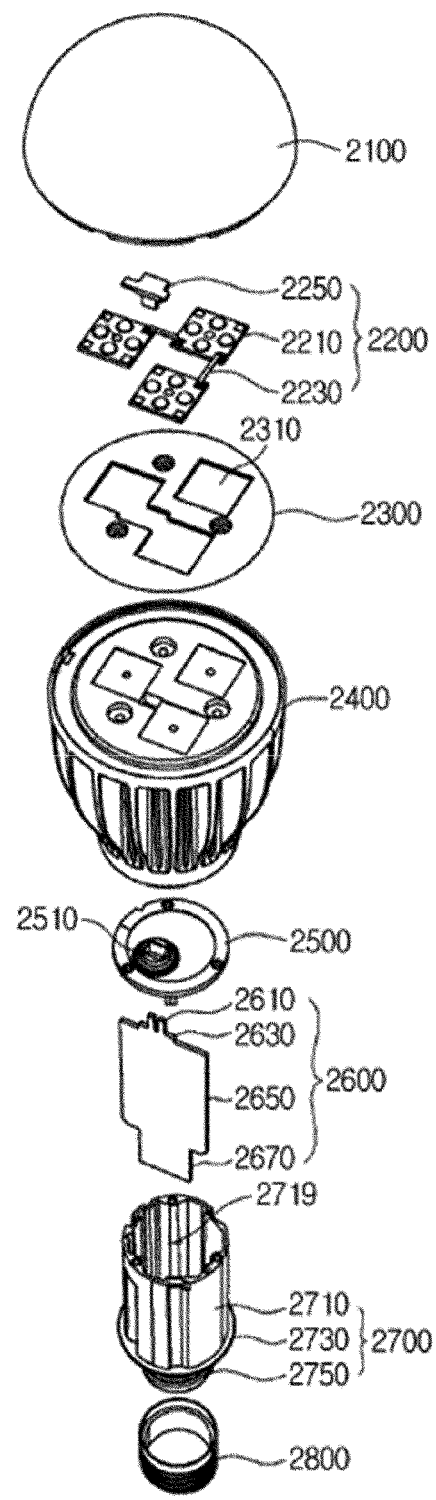

【Figure. 15】
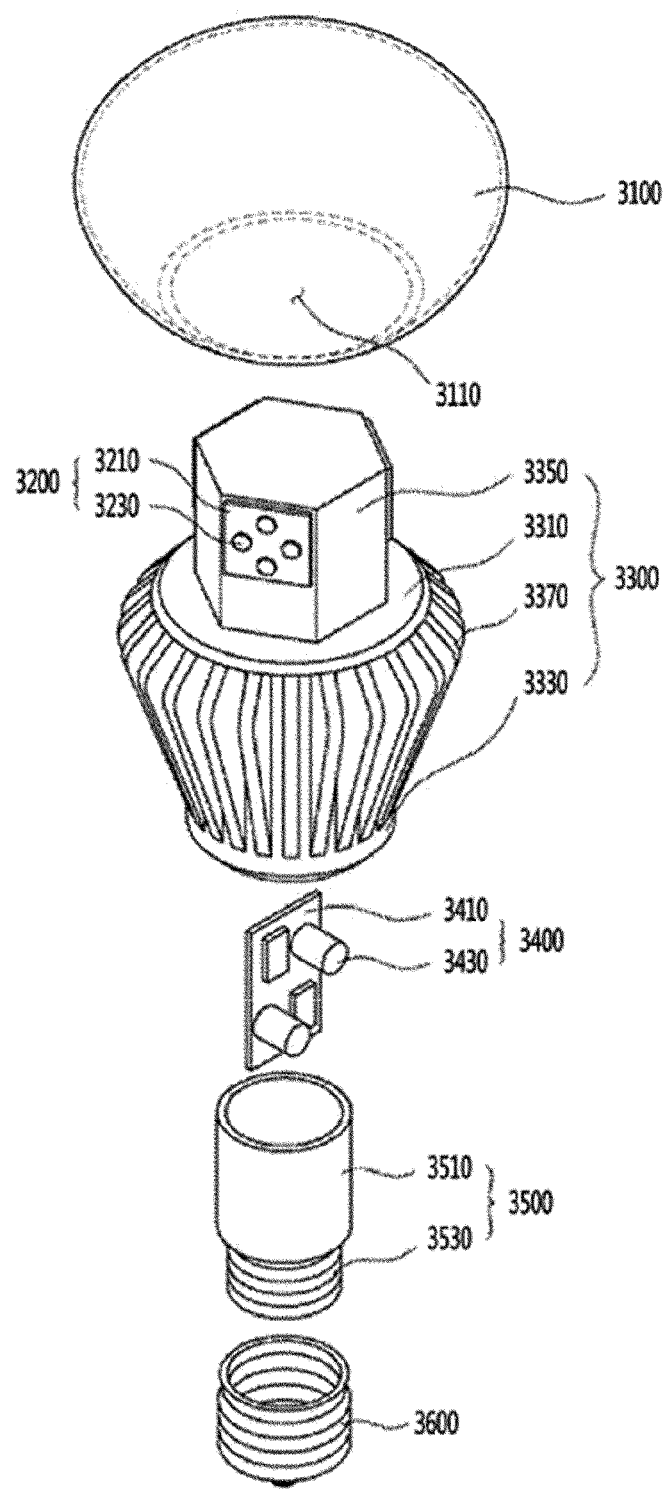

LIGHT EMITTING DEVICE PACKAGE AND LIGHTING SYSTEM COMPRISING SAME

CROSS REFERENCE TO RELATED APPLICATIONS

This application is the National Phase of PCT International Application No. PCT/KR2016/012104, filed on Oct. 26, 2016, which claims priority under 35 U.S.C. 119(a) to Patent Application No. 10-2015-0148855, filed in the Republic of Korea on Oct. 26, 2015 and to Patent Application No. 10-2015-0149181, filed in the Republic of Korea on Oct. 27, 2015, all of which are hereby expressly incorporated by reference into the present application.

TECHNICAL FIELD

Embodiments of the present disclosure relate to a light emitting device package and a lighting system including the same.

BACKGROUND ART

A light emitting diode (LED) is one of light emitting devices that emit light when a current is supplied thereto. LEDs can emit light having high efficiency at a low voltage and thus have a high energy saving effect. Recently, a problem with the luminance of LEDs has been significantly addressed, and LEDs are being applied in various devices such as backlight units of liquid crystal display (LCD) devices, electronic sign boards, indicators, home appliances, and the like.

LEDs may have a structure in which a first electrode and a second electrode are disposed on one side of a light emitting structure including a first semiconductor layer, an active layer, and a second semiconductor layer. However, when a light emitting device, which has a lateral structure in which first and second electrodes of a light emitting diode are respectively connected to first and second lead frames through wires, is used as a light source of a backlight unit, it is difficult to miniaturize the backlight unit due to the wires and the light emitting device is also vulnerable to heat dissipation.

Nitride semiconductors are attracting great interest in the development fields of optical devices and high output electronic devices due to their high thermal stability and wide bandgap energy. Particularly, blue light emitting devices, green light emitting devices, and ultraviolet (UV) light emitting devices using nitride semiconductors are being commercialized and widely used.

In the conventional general reflow method, when a flip chip package is manufactured, an ablative material called a flux is applied to a solder and is melted by applying heat. This method has a problem in that the solder is disconnected because of the risk of remelting when the solder is bonded.

DISCLOSURE

Technical Problem

Embodiments of the present disclosure are directed to providing a light emitting device package in which a light emitting surface is easily adjusted by a reflective pattern and a luminous flux is improved.

Further, embodiments of the present disclosure are directed to providing a light emitting device package with low loss in amount of light and improved reliability by arranging an adhesive, in which an epoxy and a flux are mixed, between solders during flip chip bonding, and a lighting system including the same.

Technical Solution

One aspect of the present disclosure provides a light emitting device package including a light emitting device having an electrode pad disposed on a lower surface thereof, a wavelength conversion layer configured to cover four side surfaces of the light emitting device, a first reflective pattern configured to cover an upper surface of the light emitting device and three side surfaces of the light emitting device to expose the wavelength conversion layer disposed on one remaining side surface which is a light emitting surface of the light emitting device, and a second reflective pattern disposed between the first reflective pattern and the upper surface of the light emitting device.

Another aspect of the present disclosure provides a light emitting device package including a light emitting device having an electrode pad disposed on a lower surface thereof, a wavelength conversion layer configured to cover four side surfaces of the light emitting device, a first reflective pattern configured to cover an upper surface of the light emitting device and one side surface of the light emitting device to expose the wavelength conversion layer disposed on three remaining side surfaces which are light emitting surfaces of the light emitting device, and a second reflective pattern disposed between the first reflective pattern and the upper surface of the light emitting device.

Still another aspect of the present disclosure provides a light emitting device package including a light emitting device having an electrode pad disposed on a lower surface thereof, a wavelength conversion layer configured to cover four side surfaces of the light emitting device, a first reflective pattern configured to cover an upper surface of the light emitting device and three side surfaces of the light emitting device to expose the wavelength conversion layer disposed on one remaining side surface which is a light emitting surface of the light emitting device, and a second reflective pattern disposed on an upper surface of the first reflective pattern to overlap the light emitting device with the first reflective pattern interposed therebetween.

Yet another aspect of the present disclosure provides a light emitting device package including a light emitting device having an electrode pad disposed on a lower surface thereof, a wavelength conversion layer configured to cover four side surfaces of the light emitting device, a first reflective pattern configured to cover an upper surface of the light emitting device and one side surface of the light emitting device to expose the wavelength conversion layer disposed on three remaining side surfaces which are light emitting surfaces of the light emitting device, and a second reflective pattern disposed on an upper surface of the first reflective pattern to overlap the light emitting device with the first reflective pattern interposed therebetween.

Yet another aspect of the present disclosure provides a light emitting device package including a substrate, a first solder and a second solder which are disposed on the substrate to be spaced apart from each other, an adhesive disposed between the first solder and the second solder, and a flip chip light emitting device disposed on the first solder and the second solder and electrically connected to the first solder and the second solder.

Yet another aspect of the present disclosure provides a lighting system includes the light emitting device package the light emitting device package.

Yet another aspect of the present disclosure provides a method of manufacturing a light emitting device package including arranging a first solder and a second solder on a substrate to be spaced apart from each other, applying an adhesive between the first solder and the second solder, and electrically connecting the first solder and the second solder to a flip chip light emitting device by performing reflow soldering.

Advantageous Effects

In a light emitting device package of the present disclosure, a light emitting surface of a light emitting device can be easily adjusted using a reflective pattern which surrounds the light emitting device and a luminous flux can be improved.

Therefore, when the light emitting device package according to the embodiment of the present disclosure is used as a light source of a backlight unit, a luminous flux of light which is incident on a light guide plate can be improved and the light source can also be miniaturized.

Further, according to the embodiment, an adhesive in which an epoxy and a flux are mixed is disposed between solders during flip chip bonding, and thus loss of light amount can be reduced and reliability can be improved.

Further, according to the embodiment, the adhesive in which the epoxy and the flux are mixed is disposed between the solders during flip chip bonding, and thus a short circuit phenomenon and a low current phenomenon can be prevented.

Further, according to the embodiment, a phenomenon in which a lamp does not light up can be prevented and an operation voltage can be lowered.

DESCRIPTION OF DRAWINGS

FIG. 1A is a perspective view of a light emitting device package according to a first embodiment of the present disclosure.

FIG. 1B is a cross-sectional view taken along line I-I' of FIG. 1A.

FIG. 1C is a cross-sectional view taken along line II-II' of FIG. 1A.

FIGS. 1D and 1E are cross-sectional views showing different structures of a second reflective pattern according to the first embodiment of the present disclosure.

FIG. 2A is a perspective view of a light emitting device package according to a second embodiment of the present disclosure.

FIG. 2B is a cross-sectional view taken along line I-I' of FIG. 2A.

FIG. 2C is a cross-sectional view taken along line II-II' of FIG. 2A.

FIGS. 2D to 2G are cross-sectional views showing different structures of a second reflective pattern and a third reflective pattern according to the second embodiment of the present disclosure.

FIG. 3A is a perspective view of a light emitting device package according to a third embodiment of the present disclosure.

FIG. 3B is a cross-sectional view taken along line I-I' of FIG. 3A.

FIG. 4A is a perspective view of a light emitting device package according to a fourth embodiment of the present disclosure.

FIG. 4B is a cross-sectional view taken along line I-I' of FIG. 4A.

FIG. 5A is a perspective view of a light emitting device package according to a fifth embodiment of the present disclosure.

FIG. 5B is a cross-sectional view taken along line I-I' of FIG. 5A.

FIG. 5C is a cross-sectional view taken along line II-II' of FIG. 5A.

FIG. 6A is a perspective view of a light emitting device package according to a sixth embodiment of the present disclosure.

FIG. 6B is a cross-sectional view taken along line I-I' of FIG. 6A.

FIG. 6C is a cross-sectional view taken along line II-II' of FIG. 6A.

FIG. 7A is a cross-sectional view of a light emitting device according to an embodiment of the present disclosure.

FIG. 7B is a cross-sectional view showing a structure in which a second insulating layer and a second reflective pattern of FIG. 7A are disposed with an active layer interposed therebetween.

FIG. 8A is a perspective view of a backlight unit to which the light emitting device package of the present disclosure is applied.

FIG. 8B is a cross-sectional view taken along line I-I' of FIG. 8A.

FIG. 9 is a cross-sectional view of a light emitting device package according to an embodiment.

FIGS. 10 to 13 are cross-sectional views for describing a method of manufacturing the light emitting device package according to the embodiment.

FIGS. 14 and 15 are exploded perspective views showing examples of a lighting system including the light emitting device package according to the embodiment.

MODES OF THE INVENTION

While the present disclosure is open to various modifications and alternative forms, specific embodiments thereof are shown by way of example in the drawings and will herein be described in detail. However, it should be understood that there is no intent to limit the present disclosure to the particular forms disclosed, and on the contrary, the present disclosure is to cover all modifications, equivalents, and alternatives falling within the spirit and scope of the present disclosure.

It should be understood that, although the terms "first," "second," etc. may be used herein to describe various elements, these elements are not to be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting to the present disclosure. As used herein, the singular forms "a" and "an" are intended to include the plural forms as well unless the context clearly indicates otherwise. It should be further understood that the terms "comprise," "comprising," "include," and/or "including," when used herein, specify the presence of stated features, integers, steps, operations, elements, parts, and/or combinations thereof, but do not preclude the presence or addition of one or more other features, integers, steps, operations, elements, parts, and/or combinations thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described in detail with reference to the accompanying drawings, the same or corresponding components are denoted by the same reference numerals regardless of reference numbers, and thus the description thereof will not be repeated.

Hereinafter, light emitting device packages according to embodiments will be described in detail with reference to the accompanying drawings.

First Embodiment

FIG. 1A is a perspective view of a light emitting device package according to a first embodiment of the present disclosure. FIG. 1B is a cross-sectional view taken along line I-I' of FIG. 1A, and FIG. 1C is a cross-sectional view taken along line II-II' of FIG. 1A.

As shown in FIGS. 1A, 1B, and 1C, a light emitting device package 100 according to the first embodiment of the present disclosure includes a light emitting device 10 having an electrode pad disposed on a lower surface thereof, a wavelength conversion layer 110 configured to cover four side surfaces of the light emitting device 10, a first reflective pattern 105 configured to cover an upper surface and three side surfaces of the light emitting device 10 to expose the wavelength conversion layer 110 disposed on one remaining side surface which is a light emitting surface of the light emitting device 10, and a second reflective pattern 115 disposed between the first reflective pattern 105 and the upper surface of the light emitting device 10. The light emitting device package 100 described above may be a chip scale package (CSP).

The light emitting device 10 may emit light in an ultraviolet wavelength band or light in a blue wavelength band. The light emitting device 10 may be a flip chip in which first and second electrodes (not shown) and first and second electrode pads are disposed on a lower surface thereof. The structure of the light emitting device 10 will be described below.

The second reflective pattern 115 disposed on the upper surface of the light emitting device 10 may reflect light traveling to the upper surface of the light emitting device 10 to increase an amount of light emitted to the light emitting surface of the light emitting device 10. The second reflective pattern 115 may be formed as a distributed Bragg reflector (DBR) layer. In this case, a thickness of the second reflective pattern 115 may range from 2 μm to 10 μm. There are problems in that when the thickness of the second reflective pattern 115 is smaller than 2 μm, reflectivity is low and light extraction efficiency is low, and when the thickness is greater than 10 μm, the thickness of the light emitting device 10 is increased. However, the thickness of the second reflective pattern 115 is not limited thereto.

The DBR layer may be formed in a structure in which two materials having different refractive indexes are alternately stacked. The DBR layer may be formed by repeating a first layer having a high refractive index and a second layer having a low refractive index. Both of the first layer and the second layer may be dielectric, and the high refractive index of the first layer and the low refractive index of the second layer may be relative refractive indexes. Light traveling to the DBR layer among light emitted from the light emitting device 10 may not pass through the DBR layer due to a difference in refractive index between the first layer and the second layer and may be reflected back to the light emitting device 10.

The wavelength conversion layer 110 may be formed to surround the four side surfaces of the light emitting device 10 and the upper surface of the light emitting device 10 on which the second reflective pattern 115 is disposed. The wavelength conversion layer 110 may be formed of a polymer resin in which wavelength conversion particles are dispersed. In this case, the polymer resin may be at least one selected from among a light-transmitting epoxy resin, silicone resin, polyimide resin, urea resin, and acrylic resin. For example, the polymer resin may be silicone resin.

The wavelength conversion particles may absorb the light emitted from the light emitting device 10 and convert the light into white light. For example, the wavelength conversion particles may include at least one of a phosphor and a quantum dot (QD). Hereinafter, the wavelength conversion particles will be described as a phosphor.

The phosphor may include any one of a YAG-based fluorescent material, a TAG-based fluorescent material, a silicate-based fluorescent material, a sulfide-based fluorescent material, and a nitride-based fluorescent material, but the embodiment is not limited to the type of the fluorescent material.

The YAG-based or TAG-based fluorescent material may be selected from $(Y, Tb, Lu, Sc, La, Gd, Sm)_3(Al, Ga, In, Si, Fe)_5(O, S)_{12}:Ce$, and the silicate-based fluorescent material may be selected from $(Sr, Ba, Ca, Mg)_2SiO_4:(Eu, F, Cl)$. Further, the sulfide-based fluorescent material may be selected from $(Ca, Sr)S:Eu$, $(Sr, Ca, Ba)(Al, Ga)_2S_4:Eu$, and the nitride-based fluorescent material may be $(Sr, Ca, Si, Al, O)N:Eu$ (e.g., $CaAlSiN_4:Eu$ β-SiAlON:Eu) or $(Ca_x,M_y)(Si, Al)_{12}(O,N)_{16}$ which is a $Ca_\alpha SiAlON:Eu$-based material. In this case, M may be at least one material of Eu, Tb, Yb, and Er, and may be selected from phosphor components satisfying $0.05<(x+y)<0.3$, $0.02<x<0.27$, and $0.03<y<0.3$. A red phosphor may be a nitride-based phosphor containing N (e.g., $CaAlSiN_3:Eu$) or a KSF ($K_2SiF_6$) phosphor.

The wavelength conversion layer 110 described above may be disposed to surround the side surfaces of the light emitting device 10, and a width $w_1$ of the wavelength conversion layer 110 may be changed to adjust an angle of beam spread of the light emitted from the light emitting device 10. The width $w_1$ of the wavelength conversion layer 110 may range from 70 μm to 300 μm, but the present disclosure is not limited thereto. For example, when the width $w_1$ of the wavelength conversion layer 110 ranges from 70 μm to 300 μm, the light emitted from the light emitting device 10 may have an angle of beam spread of 140° to 160°. In this case, as the width $w_1$ of the wavelength conversion layer 110 decreases, the angle of beam spread of the light may increase.

The first reflective pattern 105 may surround the light emitting device 10 to expose only one side surface, which is a light emitting surface, of the four side surfaces of the light emitting device 10. The first reflective pattern 105 may reflect the light emitted from the light emitting device 10 to adjust a direction of the light emitted from the light emitting device 10. That is, the light emitting surface of the light emitting device 10 is one side surface on which the first reflective pattern 105 is not formed, and therefore most light may be emitted through the light emitting surface.

The first reflective pattern 105 may include white silicone such as phenyl silicone and methyl silicone, and may include reflective particles to improve reflectivity. For example, the first reflective pattern 105 may be glass in which $SiO_2$ and $TiO_2$ are dispersed, but the present disclosure is not limited thereto.

When a thickness $d_2$ of the first reflective pattern 105 is too large, miniaturization of the light emitting device package 100 may be difficult. Therefore, in the embodiment, in order to miniaturize the light emitting device package 100, the thickness $d_2$ of the first reflective pattern 105 may be formed to be 100 µm or less. However, when the thickness $d_2$ is too small, the first reflective pattern 105 does not have a sufficient reflection function, and thus the light generated in the light emitting device 10 may pass through the first reflective pattern 105 to be emitted to the upper surface of the light emitting device package 100.

Furthermore, when a width $w_2$ of the first reflective pattern 105 is too small, light emitted through side surfaces of the light emitting device package 100 is increased and thus the light may be emitted from the side surfaces of the light emitting device package 100, the light also is diffused to the upper surface of the light emitting device package 100, and thus an angle of beam spread of the light emitting device package 100 may be increased. Conversely, when the width $w_2$ of the first reflective pattern 105 is too large, the light is not emitted through the side surfaces of the light emitting device package 100, the light emitted through the light emitting surface of the light emitting device 10 is increased, and thus the angle of beam spread of the light emitting device package 100 may be reduced.

Therefore, the thickness $d_2$ of the first reflective pattern 105 and the width $w_2$ of the first reflective pattern 105 according to the embodiment of the present disclosure may range from 70 µm to 100 µm. However, the thickness $d_2$ and the width $w_2$ are not limited thereto.

When the thickness $d_2$ of the first reflective pattern 105 is formed to be small in order to miniaturize the light emitting device package 100, the second reflective pattern 115 may propagate light, which may be emitted through the upper surface of the light emitting device package 100, to the light emitting surface of the light emitting device 10.

Therefore, since most light is emitted through the side surfaces of the light emitting device 10 by the second reflective pattern 115, the wavelength conversion layer 110 may not be formed on the upper surface of the light emitting device 10. Therefore, a thickness $d_1$ of the wavelength conversion layer 110 disposed on the upper surface of the light emitting device 10 may range between 0 to 80 µm, but the present disclosure is not limited thereto.

The light emitting device package 100 according to the first embodiment of the present disclosure as described above may include the second reflective pattern 115 disposed on the light emitting device 10 and the first reflective pattern 105 which exposes only one side surface, which is the light emitting surface of the light emitting device 10, and thus an amount of light emitted through the one side surface of the light emitting device 10, which is exposed by the first reflective pattern 105, may be increased.

Particularly, in order to efficiently increase the amount of the light emitted to the light emitting surface, the second reflective pattern 115 may be formed on the remaining side surfaces of the light emitting device 10 except for the light emitting surface.

FIGS. 1D and 1E are cross-sectional views showing different structures of the second reflective pattern according to the first embodiment of the present disclosure.

The second reflective pattern 115 may be formed on both side surfaces adjacent to the light emitting surface of the light emitting device 10, as shown in FIG. 1D, or on the other side surface of the light emitting device 10 opposite the light emitting surface, as shown in FIG. 1E. Although not shown, the second reflective pattern 115 may be formed on all of the side surfaces and the other side surface described above to expose only the light emitting surface of the light emitting device 10.

Second Embodiment

FIG. 2A is a perspective view of a light emitting device package according to a second embodiment of the present disclosure. FIG. 2B is a cross-sectional view taken along line I-I' of FIG. 2A, and FIG. 2C is a cross-sectional view taken along line II-II' of FIG. 2A.

A light emitting device package 100 according to the second embodiment of the present disclosure may further include a third reflective pattern 120 disposed between a light emitting device 10 and a first reflective pattern 105.

Specifically, as shown in FIGS. 2A, 2B, and 2C, in the light emitting device package 100 according to the second embodiment, the third and second reflective patterns 120 and 115 may be sequentially disposed on an upper surface of the light emitting device 10. In this case, the third reflective pattern 120 may include a metal having a high reflectivity such as Ag, Al, or the like, and may include a metal oxide such as $TiO_2$, $Al_2O_3$, $ZrO_2$, or the like.

In the light emitting device package according to the second embodiment, light traveling to the upper surface of the light emitting device 10 may be easily reflected to one side surface, which is a light emitting surface of the light emitting device 10, by the second and third reflective patterns 115 and 120, and reflectivity may be effectively improved in comparison to the light emitting device package in the first embodiment including only the second reflective pattern 115.

Particularly, in order to effectively increase an amount of light emitted to a light emitting surface, the second and third reflective patterns 115 and 120 may be further formed on the other side surfaces of the light emitting device 10 except for the light emitting surface.

FIGS. 2D to 2G are cross-sectional views showing different structures of the second reflective pattern and the third reflective pattern according to the second embodiment of the present disclosure.

As shown in FIGS. 2D and 2E, one reflective pattern selected from the second and third reflective patterns 115 and 120 may be formed on both side surfaces of the light emitting device 10 adjacent to the light emitting surface, or as shown in FIG. 2F, both of the second and third reflective patterns 115 and 120 may be formed on both side surfaces of the light emitting device 10 adjacent to the light emitting surface. Further, as shown in FIG. 2G, both of the second and third reflective patterns 115 and 120 may be formed on the other side surface of the light emitting device 10 opposite the light emitting surface.

Although not shown, only one reflective pattern selected from the second and third reflective patterns 115 and 120 may be formed on the other side surface of the light emitting device 10, and the second and third reflective patterns 115 and 120 may be formed on all of the side surfaces and the other side surface described above to expose only the light emitting surface of the light emitting device 10.

In the drawings, although the third reflective pattern 120 is shown as being disposed between the light emitting device 10 and the second reflective pattern 115, the stacking order of the second and third reflective patterns 115 and 120 is not limited thereto and may be easily changed.

In the above-described first and second embodiments of the present disclosure, the light is emitted only from one side surface of the light emitting device 10, and thus a luminous flux of the light emitted from the light emitting surface may be improved.

Third Embodiment

FIG. 3A is a perspective view of a light emitting device package according to a third embodiment of the present disclosure, and FIG. 3B is a cross-sectional view taken along line I-I' of FIG. 3A.

As shown in FIGS. 3A and 3B, a light emitting device package 100 according to the third embodiment includes a light emitting device 10 having an electrode pad disposed on a lower surface thereof, a wavelength conversion layer 110 configured to cover four side surfaces of the light emitting device 10, a first reflective pattern 105 configured to cover an upper surface of the light emitting device 10 and one side surface of the light emitting device 10 to expose the wavelength conversion layer 110 on the other three side surfaces, which are light emitting surfaces of the light emitting device 10, and a second reflective pattern 115 disposed between the first reflective pattern 105 and the upper surface of the light emitting device 10. Therefore, light may be emitted from the three side surfaces of the light emitting device 10 which are not covered by the first reflective pattern 105.

In this case, the second reflective pattern 115 may also be formed on the other side surface of the light emitting device 10 opposite the light emitting surface as in the first embodiment described above, and may not be formed on the three side surfaces which are the light emitting surfaces of the light emitting device 10 for light emission.

Fourth Embodiment

FIG. 4A is a perspective view of a light emitting device package according to a fourth embodiment of the present disclosure, and FIG. 4B is a cross-sectional view taken along line I-I' of FIG. 4A.

As shown in FIGS. 4A and 4B, third and second reflective patterns 120 and 115 may be sequentially disposed on an upper surface of a light emitting device 10. In this case, the second and third reflective patterns 115 and 120 are preferably disposed only on the upper surface of the light emitting device 10 in order to emit light from side surfaces of the light emitting device 10, and the stacking order of the second and third reflective patterns 115 and 120 may be changed.

In the third and fourth embodiments of the present disclosure described above, the second and third reflective patterns 115 and 120 may not be formed on the three side surfaces of the light emitting device 10, which are light emitting surfaces, so that light is emitted from the three side surfaces of the light emitting device 10. Further, as shown in FIGS. 1E and 2G, the second and third reflective patterns 115 and 120 may be selectively formed on the other side surfaces of the light emitting device 10 opposite the light emitting surface.

The light emitting device package 100 according to the embodiment of the present disclosure described above may use the first, second, and third reflective patterns 105, 115, and 120, which surround the light emitting device 10, to easily adjust the light emitting surface of the light emitting device 10. Further, the luminous flux of light emitted through the light emitting surface of the light emitting device 10 may be improved by the first, second, and third reflective patterns 105, 115, and 120.

Particularly, in the third and fourth embodiments of the present disclosure, the light is emitted from the three side surfaces of the light emitting device 10, and thus the luminous flux of the light may be increased by about 15% or more in comparison to when the light is emitted from one side surface of the light emitting device 10 as in the first and second embodiments. For example, when one side surface of the light emitting device 10 is a light emitting surface, the light emitting device package 100 emits light having a luminous flux of 5 lumens (1 m), but when three side surfaces of the light emitting device 10 are light emitting surfaces as in the third and fourth embodiments, the light emitting device package 100 may emit light having a luminous flux of 6.5 lumens (1 m).

In the case in which the light emitting device packages 100 according to the third and fourth embodiments are used as light sources of a backlight unit, when the light emitting device packages 100 are arranged, pitches of the adjacent light emitting device packages 100 are increased and thus the number of the light sources of the backlight unit may be reduced so that manufacturing cost may be reduced.

Further, as described above, when the light is emitted from the three side surfaces of the light emitting device package 100, the light generated in the light emitting device 10 is reflected by the second reflective pattern 115 and propagates to the three side surfaces, and thus the luminous flux of the light emitting device package may be improved in comparison to the case in which the light is emitted from one side surface as in the first and second embodiments.

Particularly, a formation position of the second reflective pattern 115 is not limited to only between the wavelength conversion layer 110 and the light emitting device 10, but the second reflective pattern 115 may be formed at any position for blocking light emission.

Fifth Embodiment

FIG. 5A is a perspective view of a light emitting device package according to a fifth embodiment of the present disclosure. FIG. 5B is a cross-sectional view taken along line I-I' of FIG. 5A, and FIG. 5C is a cross-sectional view taken along line II-II' of FIG. 5A.

As shown in FIGS. 5A, 5B, and 5C, a second reflective pattern 115 may be disposed between a first reflective pattern 105 and a wavelength conversion layer 110, and in the drawings, the second reflective pattern 115 is shown as being disposed between the first reflective pattern 105 and the wavelength conversion layer 110 in a region in which the second reflective pattern 115 overlaps an upper surface of a light emitting device 10.

Further, the second reflective pattern 115 may also be disposed between the first reflective pattern 105 and the wavelength conversion layer 110 in a region in which the second reflective pattern 115 overlaps three side surfaces except for a light emitting surface of the light emitting device 10, and thus may easily prevent the light from being emitted from the three side surfaces of the light emitting device 10.

Sixth Embodiment

FIG. 6A is a perspective view of a light emitting device package according to a sixth embodiment of the present disclosure. FIG. 6B is a cross-sectional view taken along line I-I' of FIG. 6A, and FIG. 6C is a cross-sectional view taken along line II-II' of FIG. 6A.

As shown in FIGS. 6A, 6B, and 6C, a second reflective pattern 115 may be disposed on an upper surface of a first reflective pattern 105. In the drawings, the second reflective pattern 115 is shown as being disposed to cover the upper surface of the first reflective pattern 105, but the second reflective pattern 115 may be formed to cover both side surfaces of the first reflective pattern 105 and the other side surface of the first reflective pattern 105 opposite a light emitting surface of a light emitting device 10.

That is, as described in the fifth and sixth embodiments of the present disclosure, a formation position of the second reflective pattern 115 may be easily changed in order to prevent light from being emitted from the other side surface except for the light emitting surface.

Although not shown, when the light is emitted from the three side surfaces of the light emitting device 10, the second reflective pattern 115 has the same structure as the first reflective patterns 105 of FIGS. 3A and 4A, and thus the second reflective pattern 115 may be disposed between the first reflective pattern 105 and the wavelength conversion layer 110 or may be disposed on an outer side surface of the first reflective pattern 105.

FIG. 7A is a cross-sectional view of a light emitting device according to an embodiment of the present disclosure.

As shown in FIG. 7A, a light emitting device 10 according to the embodiment of the present disclosure includes a light emitting structure including a first semiconductor layer 12, an active layer 13, and a second semiconductor layer 14, which are disposed on a substrate 11, a first electrode 16a connected to the first semiconductor layer 12, a second electrode 16b connected to the second semiconductor layer 14, and first and second electrode pads 17a and 17b respectively connected to the first and second electrodes 16a and 16b. A filling layer 20 may be further formed between the first and second electrode pads 17a and 17b to support the first and second electrode pads 17a and 17b.

The substrate 11 includes a conductive substrate or an insulating substrate. The substrate 11 may be a material suitable for semiconductor material growth or a carrier wafer. The substrate 11 may be formed on a material selected from the group consisting of sapphire ($Al_2O_3$), SiC, GaAs, GaN, ZnO, Si, GaP, InP, and Ge, but the present disclosure is not limited thereto. The substrate 11 may be removed.

A buffer layer (not shown) may be further disposed between the first semiconductor layer 12 and the substrate 11. The buffer layer may relieve the lattice mismatching between the first semiconductor layer 12 and the substrate 11. The buffer layer may be a combination of a III group element and a V group element, or may include any one of GaN, InN, AlN, InGaN, AlGaN, InAlGaN, and AlInN. The buffer layer may be doped with a dopant, but the present disclosure is not limited thereto. The buffer layer may be grown as a single crystalline layer on the substrate 11, and the buffer layer grown as a single crystalline layer may improve the crystallinity of the first semiconductor layer 12.

The first semiconductor layer 12 may be implemented using a compound semiconductor such as a III-V group element, a II-VI group element, and may be doped with a first dopant. The first semiconductor layer 12 may be selected from semiconductor materials having a composition formula of $In_{x1}Al_{y1}Ga_{1-x1-y1}N$ ($0 \leq x1 \leq 1$, $0 \leq y1 \leq 1$, and $0 \leq x1+y1 \leq 1$), for example, GaN, AlGaN, InGaN, InAlGaN, and the like. The first dopant may be an N-type dopant such as Si, Ge, Sn, Se, or Te. When the first dopant is an N-type dopant, the first semiconductor layer 12a doped with the first dopant may be an N-type semiconductor layer.

The active layer 13 is a layer in which electrons (or holes) injected through the first semiconductor layer 12a and holes (or electrons) injected through the second semiconductor layer 14 meet. The active layer 13 may transition to a low energy level as the electrons and the holes are recombined, and may generate light having a corresponding wavelength.

The active layer 13 may have any one of a single well structure, a multi-well structure, a single quantum well structure, a multi quantum well (MQW) structure, a quantum dot structure, and a quantum wire structure, but the structure of the active layer 13 is not limited thereto.

The second semiconductor layer 14 may be formed on the active layer, may be implemented using a compound semiconductor such as a III-V group element, a II-VI group element, and may be doped with a second dopant. The second semiconductor layer 14 may be formed of a semiconductor material having a composition formula of $In_{x5}Al_{y2}Ga_{1-x5-y2}N$ ($0 \leq x5 \leq 1$, $0 \leq y2 \leq 1$, and $0 = x5+y2 \leq 1$) or a material selected from the group consisting of AlInN, AlGaAs, GaP, GaAs, GaAsP, and AlGaInP. When the second dopant is a P-type dopant such as Mg, Zn, Ca, Sr, Ba, or the like, the second semiconductor layer 14 doped with the second dopant may be a P-type semiconductor layer.

The first electrode 16a may be electrically connected to the first semiconductor layer 12 through a through-hole, which passes through the first semiconductor layer 12, the active layer 13, and the second semiconductor layer 14. A first insulating layer 15a may be disposed on side surfaces of the first semiconductor layer 12, the active layer 13, and the second semiconductor layer 14, which are exposed by the through-hole, and thus may prevent the active layer 13 and the second semiconductor layer 14 from being connected to the first electrode 16a and the first electrode pad 17a. The second electrode 16b is electrically connected to the second semiconductor layer 14.

The first electrode 16a and the second electrode 16b may be made of Ag, Ni, Al, Rh, Pd, Ir, Ru, Mg, Zn, Pt, Au, Hf, Ti, Cr, Cu, or any combination thereof, but the present disclosure is not limited thereto. Further, although not shown, the first electrode 16a and the second electrode 16b may be connected to the first and second semiconductor layers 12 and 14 through an ohmic contact layer formed of a transparent conductive material such as ITO. The connection of the first and second electrodes 16a and 16b and the first and second semiconductor layers 12 and 14 is not limited thereto.

A second insulating layer 15b may be further disposed between the first electrode 16a and the first electrode pad 17a and between the second electrode 16b and the second electrode pad 17b. The second insulating layer 15b may be formed of a material which performs both an insulating function and a reflection function. For example, the second insulating layer 15b may include a DBR layer similarly to the second reflective pattern 115 described above.

In this case, in the light emitting device 10 according to the embodiment of the present disclosure, the second insulating layer 15b having a reflection function and the second reflective pattern 115 described above may be disposed with the active layer 13 interposed therebetween and facing each other.

FIG. 7B is a cross-sectional view showing a structure in which the second insulating layer and the second reflective pattern of FIG. 7A are disposed with the active layer interposed therebetween.

As shown in FIG. 7B, the second insulating layer 15b included in the light emitting device 10 and the second reflective pattern 115 disposed on the light emitting device 10 are disposed with the active layer 13 interposed therebetween and facing each other, and thus a cavity is formed between the second insulating layer 15b and the second reflective pattern 115. That is, light generated in the active layer 13 is absorbed in the light emitting device 10 and is reflected between the second insulating layer 15b and the second reflective pattern 115 without disappearing, and thus may be emitted to the outside of the light emitting device package 100. Therefore, the light extraction efficiency of the light emitting device 10 may be improved.

FIG. 8A is a perspective view of a backlight unit to which the light emitting device package of the present disclosure is applied, and FIG. 8B is a cross-sectional view taken along line I-I' of FIG. 8A which shows the light emitting device package 100 of FIG. 1B.

As shown in FIGS. 8A and 8B, the backlight unit according to the embodiment of the present disclosure includes a light emitting device array 200 including a plurality of light emitting device packages 100, a bottom cover 300, a light guide plate 310, a reflective sheet 305, and optical sheets 315.

The bottom cover 300 may have a partially open structure. The reflective sheet 305, the light guide plate 310, and the optical sheets 315 may be accommodated in the bottom cover 300. The light emitting device array 200 may be disposed at one side of the bottom cover 300. The light emitting device packages 100 may be disposed to face a light receiving surface of the light guide plate 310 so that light emitted from the light emitting device packages 100 is simply incident on the light receiving surface of the light guide plate 310.

The light emitting device array 200 has a structure in which the plurality of light emitting device packages 100 are mounted on a circuit board 320 such as a printed circuit board (PCB). The first and second electrode pads 17a and 17b (in FIG. 7b) of the light emitting device 10 (in FIG. 1a) may be mounted on the circuit board 320 through solders (not shown).

In the light emitting device package 100, a luminous flux of the emitted light is improved by the first, second, and third reflective patterns 105, 115, and 120 and thus an amount of light which is incident on the light guide plate 310 is increased. Furthermore, as described in the third and fourth embodiments of the present disclosure, when the light is emitted from the three side surfaces of the light emitting device 10, the light may also be incident on the light receiving surface of the light guide plate 310, on which the light emitting device packages 100 are not formed, and thus manufacturing cost may be reduced by reducing the number of the light sources of the backlight unit.

The light guide plate 310 scatters the light which is incident from the light emitting device packages 100 to allow the light to uniformly enter an entire screen region of a display device. The light guide plate 310 may be formed of a material having a high refractive index and transmittance, and may be formed of, for example, a material such as poly(methyl methacrylate) (PMMA), polycarbonate (PC), polyethylene (PE), or the like.

The reflective sheet 305 may reflect light traveling in a downward direction of the light guide plate 310 and propagate the light to an upper portion on which the display device is disposed. The reflective sheet 305 may be made of a material having a high reflectivity and being usable in an ultra-thin form and may be made of polyethylene terephthalate (PET).

Light emitted from the light guide plate 310 may be diffused and collected by the optical sheets 315 and incident on the display device. The optical sheets 315 may include a diffusion sheet, a prism sheet, or the like.

The light emitting device packages 100 described above according to the embodiment of the present disclosure may use the first, second, and third reflective patterns 105, 115, and 120, which surround the light emitting device 10, to easily adjust the light emitting surface of the light emitting device 10, and thus the luminous flux of the light may be improved. Therefore, when the light emitting device packages 100 according to the embodiment of the present disclosure are used as the light sources of the backlight unit, the luminous flux of the light which is incident on the light guide plate 310 may be improved.

Furthermore, in comparison to the case in which the light emitting devices have a lateral structure and are connected to the first and second lead frames through the wires which are used as the light sources of the backlight unit, the backlight unit may be miniaturized and heat generated by the driving of the light emitting device 10 may be easily emitted through the circuit board 320 on which the light emitting device packages 100 are mounted. Therefore, heat dissipation performance may be improved.

FIG. 9 is a cross-sectional view of a light emitting device package according to another embodiment.

Referring to FIG. 9, the light emitting device package according to the embodiment includes a substrate 320, a first solder 210 and a second solder 230 which are disposed on the substrate to be spaced apart from each other, an adhesive 220 disposed between the first solder 210 and the second solder 230, and a flip chip light emitting device 10, which is disposed on the first solder 210, the second solder 230, and the adhesive 220.

The light emitting device package according to the embodiment may have a structure in which the flip chip light emitting device 10 is electrically connected to the substrate. In this case, the structures described in FIGS. 1 to 7 may be applied to the structure of the light emitting device package according to the embodiment as they are. That is, a plurality of reflective patterns and a wavelength conversion layer may be disposed in the flip chip light emitting device 10 to implement a CSP.

The substrate 320 may be formed of a material having high thermal conductivity and may be a conductive substrate or an insulating substrate. For example, at least one of sapphire ($Al_2O_3$), SiC, Si, GaAs, GaN, ZnO, GaP, InP, Ge, and $Ga_2O_3$ may be used as the substrate 320. A concave and convex structure may be formed on the substrate 320, and a cross section of the concave and convex structure may be circular, elliptical, or polygonal, but the present disclosure is not limited thereto.

The first solder 210 and the second solder 230 may be made of an alloy having a composition in which one or more elements among silver (Ag), copper (Cu), bismuth (Bi), indium (In), zinc (Zn), antimony (Sb), lead (Pb), and gold (Au) are contained in tin (Sn).

The first solder 210 and the second solder 230 may be formed using at least one of vacuum deposition, electroplating, electroless plating, sputtering, screen printing, electron beam deposition, chemical vapor deposition, molecular beam epitaxy (MBE), and metal organic chemical vapor deposition (MOCVD).

The adhesive 220 may be a nonconductive adhesive or an anisotropic conductive adhesive. In the embodiment, for example, the adhesive 220 may be a mixed material of an epoxy and a flux, but the present disclosure is not limited thereto.

A vertical width H1 of the adhesive 220 may be equal to a vertical width H1 of each of the first solder 210 and the second solder 230 and, for example, may be 20 μm, but the present disclosure is not limited thereto.

Horizontal widths W1 and W3 of the first solder 210 and the second solder 230 may be equal to each other, and the vertical width H1 of the first solder 210 and the vertical width H1 of the second solder 230 may be equal to each other. For example, the vertical width H1 of each of the first solder 210 and the second solder 230 may be 20 μm, but the present disclosure is not limited thereto. The flip chip light emitting device 10 may be electrically connected to the first solder 210 and the second solder 230.

That is, in the light emitting device package according to the embodiment, the adhesive in which the epoxy and the flux are mixed is disposed between the solders, and thus when a flip chip light emitting device is bonded, solder reflow bonding and adhesive bonding may be simultaneously applied so that reliability may be improved.

Particularly, the adhesive in which the epoxy and the flux are mixed is disposed between the solders, and thus the light quantity loss may be reduced, reliability may be improved, and a short circuit phenomenon and a low current phenomenon may be prevented.

FIGS. 10 to 13 are cross-sectional views for describing a method of manufacturing a light emitting device package according to an embodiment.

Referring to FIG. 10, the method of manufacturing the light emitting device package according to the embodiment may include arranging a first solder 210 and a second solder 230 on a substrate 320 to be spaced apart from each other.

In this case, a horizontal width W4 of the first solder 210 and a horizontal width W5 of the second solder 230 may be equal to each other and a vertical width H2 of each of the first solder 210 and the second solder 230 may be 20 μm, but the present disclosure is not limited thereto.

Referring to FIG. 11, the method of manufacturing the light emitting device package may include applying an adhesive 220 between the first solder 210 and the second solder 230. The horizontal width W4 of the first solder 210 and the horizontal width W5 of the second solder 230 may be equal to a horizontal width W6 of the adhesive 220, but the present disclosure is not limited thereto. Upper surfaces of the first solder 210, the second solder 230, and the adhesive 220 may be hemispherical, circle.

Referring to FIG. 12, the method of manufacturing the light emitting device package may include electrically connecting the first solder 210 and the second solder 230 to the flip chip light emitting device 10 by reflow soldering.

Referring to FIGS. 13A and 13B, the first solder 210 and the second solder 230 may be melted by the reflow soldering and may be connected to the flip chip light emitting device 10.

FIGS. 14 and 15 are exploded perspective views showing examples of a lighting system including the light emitting device package according to the embodiment.

As shown in FIG. 14, the lighting system according to the embodiment may include a cover 2100, a light source module 2200, a heat dissipating body 2400, a power supply 2600, an inner case 2700, and a socket 2800. Further, the lighting system according to the embodiment may further include at least one of a member 2300 and a holder 2500. The light source module 2200 may include the light emitting device 10 or the light emitting device package 100 according to the embodiment.

For example, the cover 2100 may have a hollow bulb or hemispherical shape having an open portion. The cover 2100 may be optically coupled to the light source module 2200. For example, the cover 2100 may diffuse, scatter, or excite light provided from the light source module 2200. The cover 2100 may be a kind of optical member. The cover 2100 may be coupled to the heat dissipating body 2400. The cover 2100 may have a coupling portion which couples to the heat dissipating body 2400.

An inner surface of the cover 2100 may be coated with a milky white paint. The milky white paint may include a diffusing agent which diffuses light. A surface roughness of the inner surface of the cover 2100 may be greater than a surface roughness of an outer surface of the cover 2100. This is for sufficiently scattering and diffusing the light provided from the light source module 2200 and emitting the light to the outside.

The cover 2100 may be made of a material such as glass, plastic, polypropylene (PP), PE, PC, or the like. Here, PC has a high degree of light resistance, heat resistance, and strength. The cover 2100 may be transparent so that the light source module 2200 is visible from the outside, or may be opaque. The cover 2100 may be formed by blow-molding.

The light source module 2200 may be disposed on one surface of the heat dissipating body 2400. Therefore, heat from the light source module 2200 is conducted to the heat dissipating body 2400. The light source module 2200 may include light sources 2210, connection plates 2230, and a connector 2250.

The member 2300 is disposed on an upper surface of the heat dissipating body 2400, and has guide grooves 2310 into which the plurality of light sources 2210 and the connector 2250 are inserted. The guide grooves 2310 correspond to substrates of the light sources 2210 and the connector 2250.

A surface of the member 2300 may be applied or coated with a light reflective material.

For example, the surface of the member 2300 may be applied or coated with a white paint. The member 2300 reflects light, which is reflected by the inner surface of the cover 2100 and returned toward the light source module 2200, toward the cover 2100 again.

Therefore, the light efficiency of the lighting system according to the embodiment may be improved.

For example, the member 2300 may be made of an insulating material. The connection plates 2230 of the light source module 2200 may include an electrically conductive material. Therefore, the heat dissipating body 2400 may be in electrical contact with the connection plates 2230. The member 2300 may be made of an insulating material to prevent an electrical short circuit between the connection plate 2230 and the heat dissipating body 2400. The heat dissipating body 2400 may receive and dissipate heat from the light source module 2200 and the power supply 2600.

The holder 2500 blocks an accommodating groove 2719 of an insulating portion 2710 of the inner case 2700. Therefore, the power supply 2600 accommodated in the insulating portion 2710 of the inner case 2700 is sealed. The holder 2500 has a guide protrusion 2510. The guide protrusion 2510 has a hole through which a protrusion 2610 of the power supply 2600 passes.

The power supply 2600 processes or converts an electrical signal provided from the outside and provides the converted electrical signal to the light source module 2200. The power supply 2600 is accommodated in the accommodating groove 2719 of the inner case 2700 and is sealed inside the inner case 2700 by the holder 2500.

The power supply 2600 may include the protrusion 2610, a guide portion 2630, a base 2650, and an extension portion 2670.

The guide portion 2630 has a shape protruding outward from one side of the base 2650. The guide portion 2630 may be inserted into the holder 2500. A plurality of parts may be disposed on one surface of the base 2650. For example, the plurality of parts may include a direct current (DC) converter for converting alternating current (AC) power supplied from an external power source into DC power, a driving chip for controlling the driving of the light source module 2200, an electrostatic discharge (ESD) protection device for protecting the light source module 2200, and the like, but the present disclosure is not limited thereto.

The extension portion 2670 has a shape protruding outward from the other side of the base 2650. The extension portion 2670 is inserted into a connection portion 2750 of the inner case 2700, and receives an electrical signal from the outside. For example, the extension portion 2670 may be provided to have a width smaller than or equal to that of the connection portion 2750 of the inner case 2700. One end of each of a positive (+) wire and a negative (−) wire may be electrically connected to the extension portion 2670, and the other end of each of the positive (+) wire and the negative (−) wire may be electrically connected to the socket 2800.

The inner case 2700 may include a molding portion along with the power supply 2600. The molding portion is a portion in which a molding liquid is cured, so that the power supply 2600 may be fixed inside the inner case 2700.

Further, as shown in FIG. 15, a lighting system according to the embodiment may include a cover 3100, a light source 3200, a heat dissipating body 3300, a circuit portion 3400, an inner case 3500, and a socket 3600. The light source 3200 may include the light emitting device or the light emitting device package according to the embodiment.

The cover 3100 has a hollow bulb shape. The cover 3100 has an opening 3110. The light source 3200 and a member 3350 may be inserted into the cover 3100 through the opening 3110.

The cover 3100 may be coupled to the heat dissipating body 3300 and may surround the light source 3200 and the member 3350. The light source 3200 and the member 3350 may be blocked from the outside due to the combination of the cover 3100 and the heat dissipating body 3300. The cover 3100 and the heat dissipating body 3300 may be coupled using an adhesive, and may be coupled using various methods such as a rotational coupling method and a hook coupling method. The rotational coupling method is a method in which a screw thread of the cover 3100 is coupled to a screw groove of the heat dissipating body 3300 so that the cover 3100 and the heat dissipating body 3300 are coupled by the rotation of the cover 3100. The hook coupling method is a method in which a jaw of the cover 3100 is fitted in a groove of the heat dissipating body 3300 so that the cover 3100 and the heat dissipating body 3300 are coupled.

The cover 3100 is optically coupled to the light source 3200. Specifically, the cover 3100 may diffuse, scatter, or excite light from a light emitting device 3230 of the light source 3200. The cover 3100 may be a kind of optical member. Here, the cover 3100 may have a phosphor disposed on an inside or outside surface or inside thereof in order to excite the light provided from the light source 3200.

An inner surface of the cover 3100 may be coated with a milky white paint. Here, the milky white paint may include a diffusing agent for diffusing light. A surface roughness of the inner surface of the cover 3100 may be greater than a surface roughness of an outer surface of the cover 3100. This is for sufficiently scattering and diffusing the light from the light source 3200.

The cover 3100 may be made of a material such as glass, plastic, PP, PE, PC, or the like. Here, PC has a high degree of light resistance, heat resistance, and strength. The cover 3100 may be a transparent material so that the light source module 2200 is visible from the outside, and may be an opaque material so that the light source module 2200 is not visible from the outside. For example, the cover 3100 may be formed by blow-molding.

The light source 3200 may be disposed on the member 3350 of the heat dissipating body 3300 and may include a plurality of light sources. Specifically, the light source 3200 may be disposed on at least one of a plurality of side surfaces of the member 3350. The light source 3200 may also be disposed on an upper end of the side surface of the member 3350.

The light source 3200 may be disposed on three of six side surfaces of the member 3350. However, the present disclosure is not limited thereto, and the light source 3200 may be disposed on all the side surfaces of the member 3350. The light source 3200 may include a substrate 3210 and light emitting devices 3230. The light emitting devices 3230 may be disposed on one surface of the substrate 3210.

The substrate 3210 may have a quadrilateral plate shape, but the present disclosure is not limited thereto, and the substrate 3210 may have various shapes. For example, the substrate 3210 may have a circular or polygonal plate shape. The substrate 3210 may be a board in which a circuit pattern is printed on an insulator, and may include, for example, a general PCB, a metal core, a PCB, a flexible PCB, a ceramic PCB, and the like. Further, a chips-on-board (COB) type substrate, which is a PCB onto which unpackaged LED chips may be directly bonded, may be used. Further, the substrate 3210 may be formed of a material which efficiently reflects light, or a surface thereof may be formed with a color such as white, silver, or the like which efficiently reflects light. The substrate 3210 may be electrically connected to the circuit portion 3400 accommodated in the heat dissipating body 3300. The substrate 3210 and the circuit portion 3400 may be connected to each other, for example, through a wire. The wire may pass through the heat dissipating body 3300 and connect the substrate 3210 to the circuit portion 3400.

The light emitting device 3230 may be a light emitting diode chip which emits red, green, or blue light, or a light emitting diode chip which emits ultraviolet (UV) light. Here, the light emitting diode chip may be a lateral type light emitting diode chip or a vertical type light emitting diode chip, and the light emitting diode chip may emit blue, red, yellow, or green light.

The light emitting device 3230 may have a phosphor. The phosphor may be at least one of a garnet-based phosphor (YAG or TAG), a silicate-based phosphor, a nitride-based phosphor, and an oxynitride-based phosphor. Alternatively, the phosphor may be at least one of a yellow phosphor, a green phosphor, and a red phosphor.

The heat dissipating body 3300 may be coupled to the cover 3100 and may dissipate heat from the light source 3200. The heat dissipating body 3300 has a predetermined volume and includes an upper surface 3310 and a side surface 3330. The member 3350 may be disposed on the upper surface 3310 of the heat dissipating body 3300. The upper surface 3310 of the heat dissipating body 3300 may be coupled to the cover 3100.

The upper surface 3310 of the heat dissipating body 3300 may have a shape corresponding to that of the opening 3110 of the cover 3100.

A plurality of heat dissipating fins 3370 may be disposed on the side surface 3330 of the heat dissipating body 3300. The heat dissipating fins 3370 may extend from the side surface 3330 of the heat dissipating body 3300 or may be connected to the side surface 3330. The heat dissipating fins 3370 may increase a heat dissipation area of the heat dissipating body 3300 to improve the heat dissipation efficiency. Here, the side surface 3330 may also not include the heat dissipating fins 3370.

The member 3350 may be disposed on the upper surface 3310 of the heat dissipating body 3300. The member 3350 may be integrated with the upper surface 3310 or may be coupled to the upper surface 3310.

The member 3350 may be a polygonal column. Specifically, the member 3350 may be a hexagonal column. The member 3350 having a hexagonal column shape has an upper surface, a lower surface, and six side surfaces. Here, the member 3350 may also be a circular column or an elliptical column as well as a polygonal column. When the member 3350 is a circular column or an elliptical column, the substrate 3210 of the light source 3200 may be a flexible substrate.

The light sources 3200 may be disposed on the six side surfaces of the member 3350. The light sources 3200 may be disposed on all the six side surfaces of the member 3350 or may be disposed on some of the six side surfaces of the member 3350. In FIG. 11, the light sources 3200 may be disposed on three of the six side surfaces of the member 3350.

The substrate 3210 is disposed on the side surface of the member 3350. The side surface of the member 3350 may be substantially perpendicular to the upper surface 3310 of the heat dissipating body 3300. Therefore, the substrate 3210 and the upper surface 3310 of the heat dissipating body 3300 may be substantially perpendicular to each other.

A material of the member 3350 may be a material having thermal conductivity. This is for rapidly receiving heat generated from the light sources 3200. The material of the member 3350 may be, for example, aluminum (Al), nickel (Ni), copper (Cu), magnesium (Mg), silver (Ag), tin (Sn), or the like. Alternatively, the member 3350 may be formed of thermally conductive plastic having thermal conductivity. The thermally conductive plastic is advantageous in that the thermally conductive plastic is lighter in weight than a metal and has unidirectional thermal conductivity.

The circuit portion 3400 receives power from the outside and converts the supplied power to be used in the light source 3200. The circuit portion 3400 supplies the converted power to the light source 3200. The circuit portion 3400 may be disposed in the heat dissipating body 3300.

Specifically, the circuit portion 3400 may be accommodated in the inner case 3500 and may be accommodated in the heat dissipating body 3300 along with the inner case 3500. The circuit portion 3400 may include a circuit board 3410 and a plurality of parts 3430 mounted on the circuit board 3410.

The circuit board 3410 may have a circular plate shape, but the present disclosure is not limited thereto, and the circuit board 3410 may have various shapes. For example, the circuit board 3410 may be an elliptical or polygonal plate shape. The circuit board 3410 may be a board in which a circuit pattern is printed on an insulator.

The circuit board 3410 is electrically connected to the substrate 3210 of the light source 3200. The circuit board 3410 and the substrate 3210 may be electrically connected, for example, through a wire. The wire may be disposed inside the heat dissipating body 3300 to connect the circuit board 3410 to the substrate 3210.

For example, the plurality of parts 3430 may include a DC converter for converting AC power supplied from an external power source into DC power, a driving chip for controlling the driving of the light source 3200, an ESD protection device for protecting the light source 3200, and the like.

The inner case 3500 accommodates the circuit portion 3400 therein. The inner case 3500 may have an accommodating portion 3510 for accommodating the circuit portion 3400.

For example, the accommodating portion 3510 may have a cylindrical shape. The shape of the accommodating portion 3510 may vary according to the shape of the heat dissipating body 3300. The inner case 3500 may be accommodated in the heat dissipating body 3300. The accommodating portion 3510 of the inner case 3500 may be accommodated in an accommodating portion formed on a lower surface of the heat dissipating body 3300.

The inner case 3500 may be coupled to the socket 3600. The inner case 3500 may have a connection portion 3530 coupled to the socket 3600. The connection portion 3530 may have a screw threaded structure corresponding to a screw groove structure of the socket 3600. The inner case 3500 is nonconductive. Therefore, the inner case 3500 prevents an electrical short circuit between the circuit portion 3400 and the heat dissipating body 3300. For example, the inner case 3500 may be formed of plastic or a resin material.

The socket 3600 may be coupled to the inner case 3500. Specifically, the socket 3600 may be coupled to the connection portion 3530 of the inner case 3500. The socket 3600 may have the same structure as the conventional incandescent bulb. The circuit portion 3400 and the socket 3600 are electrically connected. The circuit portion 3400 and the socket 3600 may be electrically connected through a wire. Therefore, when external power is supplied to the socket 3600, the external power may be transmitted to the circuit portion 3400. The socket 3600 may have a screw groove structure corresponding to a screw thread structure of the connection portion 3530.

While the exemplary embodiments of the present disclosure and their advantages have been described in detail with reference to the accompanying drawings, it will be apparent to those skilled in the art to which the present disclosure belongs that various changes, substitutions and alterations may be made herein without departing from the scope of the present disclosure.

The invention claimed is:

1. A light emitting device package comprising:

a light emitting device including a lower surface, an upper surface opposite to the lower surface, and a side surface disposed between the lower surface and the upper surface;

a wavelength conversion member disposed on the light emitting device;

a first reflective member disposed on the wavelength conversion member; and a second reflective member disposed between the first reflective member and the light emitting device, wherein the side surface of the light emitting device includes a light extractive side surface and a reflective side surface, wherein the second reflective member contacts the upper surface of the light emitting device and the reflective side surface of the light emitting device, wherein the wavelength conversion member includes a light extractive side plane, a covered side plane, an upper plane, and a lower plane, wherein the first reflective member covers the covered side plane and the upper plane of the wavelength conversion member, wherein the lower surface of the light emitting device and the light extractive side plane of the wavelength conversion member are exposed, wherein a side surface of the second reflective member is between the side surface of the light emitting device and the covered side plane of the wavelength conversion member and covers the reflective side surface of the light emitting device, and wherein the side surface of the second reflective member is opened between the light extractive side plane of the wavelength conversion member and the light extractive side surface of the light emitting device.

2. The light emitting device package of claim 1, wherein the wavelength conversion member is further disposed between the second reflective member and the upper surface of the light emitting device.

3. The light emitting device package of claim 1, wherein the second reflective member further surrounds the reflective side surface of the light emitting device, and wherein the covered side plane and the upper plane of the wavelength conversion member contact all side surfaces of the first reflective member and the second reflective member.

4. The light emitting device package of claim 1, further comprising a third reflective member disposed between the first reflective member and the light emitting device.

5. The light emitting device package of claim 1, wherein the first reflective member includes white silicone, such as phenyl silicone or methyl silicone, or silicone including reflective particles.

6. The light emitting device package of claim 1, wherein the second reflective member includes a distributed Bragg reflector (DBR) layer.

7. The light emitting device package of claim 4, wherein the third reflective member includes a metal, such as Ag or Al, or a metal oxide such as $TiO_2$, $Al_2O_3$, or $ZrO_2$.

* * * * *